(12) United States Patent
Ip et al.

(10) Patent No.: US 10,409,945 B1
(45) Date of Patent: Sep. 10, 2019

(54) METHODS, SYSTEMS, AND COMPUTER PROGRAM PRODUCT FOR CONNECTIVITY VERIFICATION OF ELECTRONIC DESIGNS

(71) Applicant: Cadence Design Systems, Inc., San Jose, CA (US)

(72) Inventors: Chung-Wah Norris Ip, Cupertino, CA (US); Georgia Penido Safe, Belo Horizonte (BR); Guilherme Henrique de Sousa Santos, Belo Horizonte (BR); Adriana Cassia Rossi de Almeida Braz, Brasilia (BR)

(73) Assignee: Cadence Design Systems, Inc., San Jose, CA (US)

( * ) Notice: Subject to any disclaimer, the term of this patent is extended or adjusted under 35 U.S.C. 154(b) by 292 days.

(21) Appl. No.: 14/754,331

(22) Filed: Jun. 29, 2015

(51) Int. Cl.
G06F 17/50 (2006.01)

(52) U.S. Cl.
CPC ...... *G06F 17/5081* (2013.01); *G06F 17/5072* (2013.01)

(58) Field of Classification Search
USPC ....................................................... 716/131
See application file for complete search history.

(56) References Cited

U.S. PATENT DOCUMENTS

| | | |
|---|---|---|
| 5,140,526 A | 8/1992 | McDermith |
| 5,623,420 A | 4/1997 | Yee |
| 6,412,097 B1 | 6/2002 | Kikuchi |
| 6,836,877 B1 * | 12/2004 | Dupenloup ......... G06F 17/5045 716/103 |
| 6,915,248 B1 | 7/2005 | Ip et al. |
| 7,065,726 B1 | 6/2006 | Singhal et al. |
| 7,159,198 B1 | 1/2007 | Ip et al. |
| 7,237,208 B1 | 6/2007 | Ip et al. |
| 7,421,668 B1 | 9/2008 | Ip et al. |
| 7,437,694 B1 | 10/2008 | Loh et al. |
| 7,506,288 B1 | 3/2009 | Ip et al. |
| 7,584,443 B1 | 9/2009 | Govig |
| 7,689,942 B2 | 3/2010 | Acar |
| 7,761,836 B1 | 7/2010 | Wadland |
| 7,770,142 B1 | 8/2010 | Shmayovitsh |

(Continued)

OTHER PUBLICATIONS

Non-Final Office Action dated Dec. 1, 2016 for U.S. Appl. No. 14/754,630.

(Continued)

*Primary Examiner* — Eric D Lee
(74) *Attorney, Agent, or Firm* — Vista IP Law Group, LLP

(57) ABSTRACT

Disclosed are techniques for verifying connectivity of an electronic design. These techniques Identify connectivity information for a design description of an electronic design, generate a partition of a plurality of partitions for the connectivity information by partitioning the connectivity into the plurality of partitions based in part or in whole upon one or more factors, and performing a pre-proof verification flow on the partition by proving or disproving at least one connection candidate of a plurality of connection candidates for the partition to generate proof results for the partition. These techniques may further additionally generate a property for a connection candidate that fails to result in definitive proof results and prove or disprove the property with formal methods or techniques.

24 Claims, 17 Drawing Sheets

(56) References Cited

U.S. PATENT DOCUMENTS

| | | |
|---|---|---|
| 7,870,523 B1 | 1/2011 | Uziel |
| 7,895,552 B1 | 2/2011 | Singhal et al. |
| 8,205,187 B1 | 6/2012 | Coelho et al. |
| 8,527,911 B1 | 9/2013 | Kranen et al. |
| 8,621,411 B1 | 12/2013 | Ward |
| 8,630,824 B1 | 1/2014 | Ip et al. |
| 8,683,419 B1 | 3/2014 | Hines |
| 8,731,894 B1 | 5/2014 | Kranen et al. |
| 8,762,898 B1 | 6/2014 | Maziasz |
| 8,831,925 B1 | 9/2014 | Kranen et al. |
| 8,863,049 B1 | 10/2014 | Lungren et al. |
| 8,984,461 B1 | 3/2015 | Ip et al. |
| 8,990,745 B1 | 3/2015 | Coelho et al. |
| 9,081,927 B2 | 7/2015 | Coelho et al. |
| 9,251,299 B1 | 2/2016 | Salowe |
| 9,275,178 B1 | 3/2016 | Fung |
| 9,449,196 B1 | 9/2016 | Purri et al. |
| 9,477,802 B1 | 10/2016 | Ip et al. |
| 2003/0056186 A1 | 3/2003 | Satoh |
| 2005/0268267 A1 | 12/2005 | Shang |
| 2008/0077893 A1* | 3/2008 | Korson ............ G01R 31/31715 716/106 |
| 2008/0168412 A1 | 7/2008 | Cheon |
| 2008/0294390 A1 | 11/2008 | Ravnikar |
| 2009/0027392 A1 | 1/2009 | Jadhav |
| 2009/0282379 A1 | 11/2009 | Singh |
| 2010/0095256 A1 | 4/2010 | Kavalpati |
| 2010/0115485 A1 | 5/2010 | Nonaka |
| 2010/0281444 A1 | 11/2010 | Zejda |
| 2011/0131540 A1 | 6/2011 | Wu |
| 2013/0125072 A1 | 5/2013 | Newcomb |
| 2013/0185686 A1 | 7/2013 | Nishimoto |
| 2013/0219353 A1 | 8/2013 | Henrickson |
| 2014/0033158 A1 | 1/2014 | Chang |
| 2015/0095862 A1 | 4/2015 | Ip et al. |
| 2015/0100932 A1 | 4/2015 | Coelho et al. |
| 2015/0100933 A1 | 4/2015 | Coelho et al. |
| 2015/0121326 A1 | 4/2015 | De |
| 2016/0140281 A1 | 5/2016 | Harer |
| 2016/0154902 A1 | 6/2016 | Korthikanti |

OTHER PUBLICATIONS

Notice of Allowance dated Apr. 5, 2017 for U.S. Appl. No. 14/754,630.

* cited by examiner

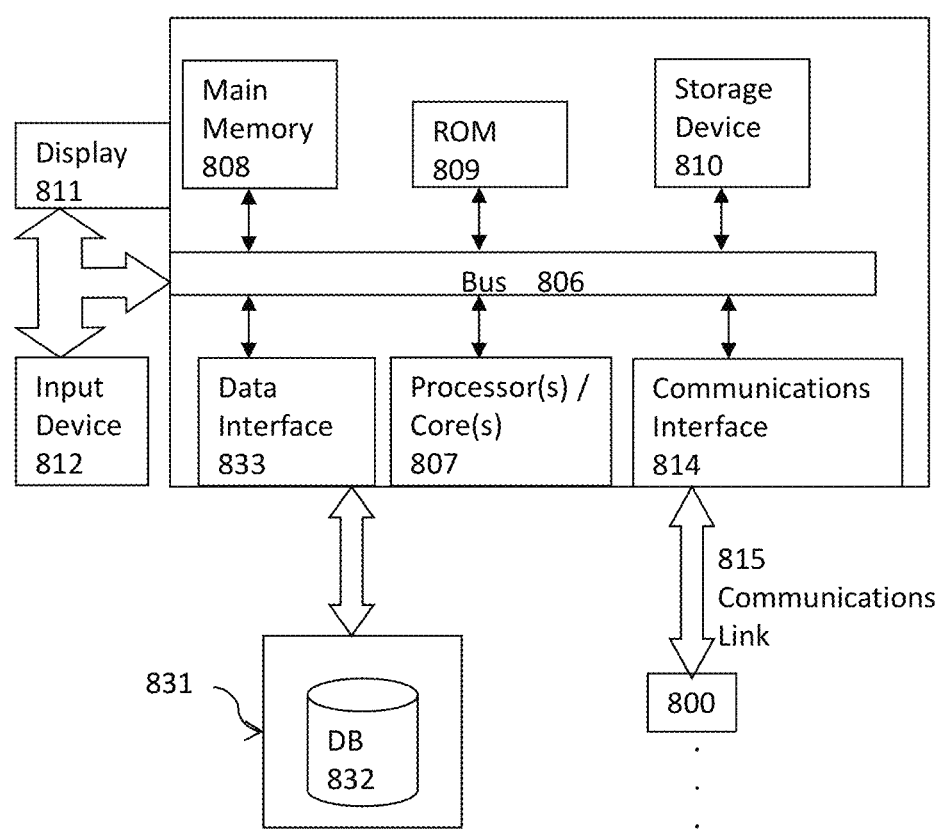

METHODS, SYSTEMS, AND COMPUTER PROGRAM PRODUCT FOR CONNECTIVITY VERIFICATION OF ELECTRONIC DESIGNS

CROSS REFERENCE TO RELATED APPLICATION(S)

This application is cross related to U.S. patent application Ser. No. 14/754,630, filed concurrently and entitled "METHODS, SYSTEMS, AND ARTICLES OF MANUFACTURE FOR AUTOMATIC EXTRACTION OF CONNECTIVITY INFORMATION FOR IMPLEMENTATION OF ELECTRONIC DESIGNS". The content of the aforementioned U.S. patent application is hereby expressly incorporated by reference in its entirety for all purposes.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Formal connectivity verification has become an important part of the verification flow. Nonetheless, the sheer amount of connectivity information has grown to a point where elaboration of design description becomes cumbersome as the complexity of modern electronic designs grows.

Conventional approaches for connectivity verification often adopt brute force techniques that rely on the computing power of powerful computing systems to prove or disprove the connectivity of an electronic design. Some conventional approaches further perform full elaboration for an electronic design and/or perform connectivity verification on the entire set of connectivity. The ever increasing number of connections to be verified in a modern electronic design poses a serious challenge in the performance, speed, and efficiency to these conventional approaches.

Therefore, there exists a need for a method, system, and computer program product for connectivity verification in electronic designs.

SUMMARY

Disclosed are method(s), system(s), and article(s) of manufacture for verifying connectivity of an electronic design in various embodiments. Some first embodiments are directed at a method for verifying connectivity of an electronic design.

Some first embodiments are directed at a method for verifying connectivity of an electronic design. In these first embodiments, connectivity information may be identified for a design description of an electronic design, a partition of a plurality of partitions for the connectivity information may be generated by partitioning the connectivity into the plurality of partitions based in part or in whole upon one or more factors, and a pre-proof verification flow on the partition may be performed by proving or disproving at least one connection candidate of a plurality of connection candidates for the partition to generate proof results for the partition. In some of these first embodiments, the pre-proof verification flow is performed without using formal verification methods or formal verification techniques.

In addition or in the alternative, at least a portion of the design description may be identified for the electronic design corresponding to the partition of the plurality of partitions, a connectivity specification for the partition may be generated from the design description, and a connection check may be identified from the plurality of connection candidates for the partition. In some of these immediately preceding embodiments, a blackbox list may be identified for the partition, and one or more modules and/or one or more circuit components in the blackbox list may be blackboxed when elaborating the design description for the analysis of the partition, wherein the design description includes a register transfer level design for at least a portion of the electronic design corresponding to the partition. In addition or in the alternative, the pre-proof verification flow may be performed while ignoring the one or more modules and/or one or more circuit components in the blackbox list, and the connection check may be prove or disprove at least by determining whether a path for the connection check is found.

In some of these first embodiments, a partial or a full elaboration may be performed on the design description with a multi-elaboration mechanism, wherein the connectivity information includes a connection list structure, and the partition of the plurality of partitions may be identified or generated at least by partitioning the connection list structure into the plurality of partitions. In some of the first embodiments, a blackbox list may be determined for the partition, wherein the blackbox list includes a set of modules and/or circuit components. In some of these embodiments, one or more connection checks may be identified from the plurality of connection candidates for the partition, and one or more lists of modules and/or circuit components may be identified for the partition.

In addition, a list of all modules and circuit components may be identified as necessary for the analysis of the partition, and the blackbox list may be determined at least by subtracting the one or more lists from the list of all modules and circuit components. In some of the first embodiments, one or more connection candidates may be identified from the plurality of connection candidates, wherein the one or more connection candidates fail to result in definitive proof results, one or more properties may be generated for the one or more connection candidates, and the one or more properties may be proved or disproved with formal methods or formal techniques.

In some of the first embodiments, the act of identifying the connectivity information may include the acts of identifying one or more connection classes, generating or updating an extraction configuration based in part or in whole upon the one or more connection classes, and generating or extracting at least the plurality of connection candidates into the connectivity information. In some of the immediately preceding embodiments, the act of identifying the connectivity information may further include the acts of identifying a list of modules or circuit components for at least one connection candidate and generating a key for the at least one connection candidate, maybe by concatenating sorted names of the list of modules or circuit components into a key structure that comprises a plurality of keys.

In addition or in the alternative, a target number of partitions may be identified, one or more numbers of connection checks may be determined for keys in the key structure, and the keys in the key structure may be sorted based in part the one or more numbers of connection checks.

In some embodiments, a target partition may be identified through grouping keys into key groups, by comparing the list of modules or circuit components associated with the key for the at least one connection candidate based in part or in whole on an existing number of connection checks in the target partition, and/or the one or more numbers of connection checks for the keys; connection checks with keys in the same key group may be placed in the connection partition; and information or data for the partition may be stored in a non-transitory computer readable storage medium.

Some embodiments are directed at one or more hardware mechanisms that include and/or function in conjunction with at least one micro-processor as well as other related components or architectures of one or more computing systems and may be invoked to perform any of the methods, processes, or sub-processes disclosed herein. The hardware system may include one or more variants of a multi-elaboration mechanism, a blackbox mechanism, a property generation mechanism, a formal proof mechanism, a classification and partitioning mechanism, and/or a pre-proof mechanism in some embodiments.

Each of these mechanisms may include or function in tandem with electrical circuitry and one or more microprocessors each having one or more processor cores to perform its intended functions. The hardware system may further include one or more forms of non-transitory machine-readable storage media or persistent storage devices to temporarily or persistently store various types of data or information, various design rules, various libraries, selected and selectable targets, or any other suitable information or data, etc. A mechanism may be initialized in a computing system so that the software portion of the mechanism is stored in memory (e.g., random access memory) to be executed by one or more processors or processor cores off the computing system to perform at least a part of the functionality of the mechanism. Some illustrative modules or components of the hardware system may be found in the System Architecture Overview section below.

Some embodiments are directed at an article of manufacture that includes a non-transitory machine-accessible storage medium having stored thereupon a sequence of instructions which, when executed by at least one micro-processor or at least one processor core, causes the at least one micro-processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for verifying connectivity of an electronic design are described below with reference to FIGS. 1-8.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 8 illustrates a computerized system on which a method for verifying connectivity of an electronic design may be implemented.

DETAILED DESCRIPTION

Various embodiments are directed to a method, system, and computer program product for verifying connectivity of an electronic design. Other objects, features, and advantages of the invention are described in the detailed description, figures, and claims.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s). Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-8.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Figure 1:
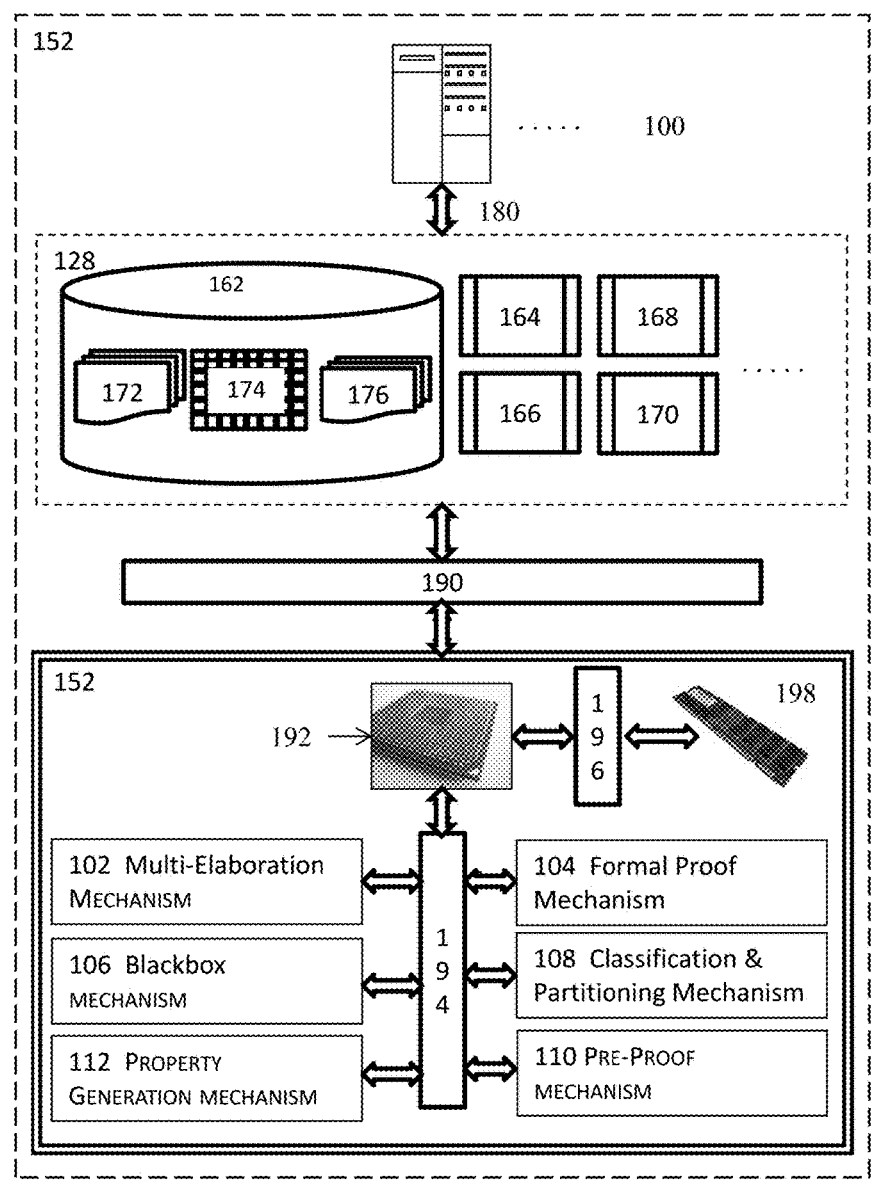
FIG. 1 illustrates a high level block diagram of an electronic design automation system for verifying connectivity of an electronic design in one or more embodiments.

FIG. 1 illustrates a illustrative high level schematic block diagrams for verifying connectivity of an electronic design. In one or more embodiments, FIG. 1 illustrates an illustrative high level schematic block diagrams for verifying connectivity of an electronic design and may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access, via a computer bus architecture (e.g., a system bus, a control bus, a data bus, or any combinations thereof), various resources 128 that may comprise a floorplanner, a global routing engine, and/or a detail routing engine 164, a layout editor 166, a design rule checker 168, a verification engine 170, etc.

The one or more computing systems 100 may further write to and read from a local or remote non-transitory computer accessible storage 162 that stores thereupon data or information such as, but not limited to, one or more databases (174) such as schematic design database(s) or physical design database(s), electronic circuit design specification database(s), various statistics, various data, rule decks, various design rules, constraints, etc. (172), or other information or data (176) that may be used to facilitate the performance of various functions to achieve the intended purposes.

In some embodiments, the one or more computing systems 100 may include or, either directly or indirectly through the various resources 128, invoke a set of mechanisms 152 including hardware mechanisms and software modules or combinations of one or more hardware mechanisms and one or more software modules that may comprises one or more multi-elaboration mechanisms 102 to elaborate an electronic design (e.g., an RTL or register transfer level design) in whole or in part. The set of mechanisms 152 may further include one or more formal proof mechanisms 104 to prove or disprove the correctness of an electronic design or a portion thereof with respect to a formal specification or property by using formal methods or mathematics.

The set of mechanisms 152 may further optionally include one or more blackbox mechanisms 106 to what circuit component designs may be included in a blackbox and/or to blackbox one or more circuit component designs in one or more blackboxes. In addition or in the alternative, the set of mechanisms 152 may further include one or more classification and partitioning mechanisms 108 to classify or categorize connections into a plurality of classes or types (collectively classes or a class) and/or to partition a connection list into multiple partitions based in part or in whole upon one or more criteria. In some embodiments, the set of mechanisms 152 may further include one or more pre-proof mechanisms 110 to pre-prove one or more connections in a current proof session (e.g., a helper session) by using at least the current elaboration of an electronic design or a portion thereof.

In some embodiments, the computing system 100 may include the various resources 128 such that these various resources may be invoked from within the computing system via a computer bus 180 (e.g., a data bus interfacing a microprocessor 192 and the non-transitory computer accessible storage medium 198 or a system bus 190 between a microprocessor 192 and one or more engines in the various resources 128). In some other embodiments, some or all of these various resources may be located remotely from the computing system 100 such that the computing system may access the some or all of these resources via a computer bus 180 and one or more network components.

The computing system may also include one or more mechanisms in the set of mechanisms 152. One or more mechanisms in the set 152 may include or at least function in tandem with a microprocessor 192 via a computer bus 194 in some embodiments. In these embodiments, a single microprocessor 192 may be included in and thus shared among more than one mechanism even when the computing system 100 includes only one microprocessor 192. A microprocessor 192 may further access some non-transitory memory 198 (e.g., random access memory or RAM) via a system bus 196 to read and/or write data during the microprocessor's execution of processes.

Figure 2:
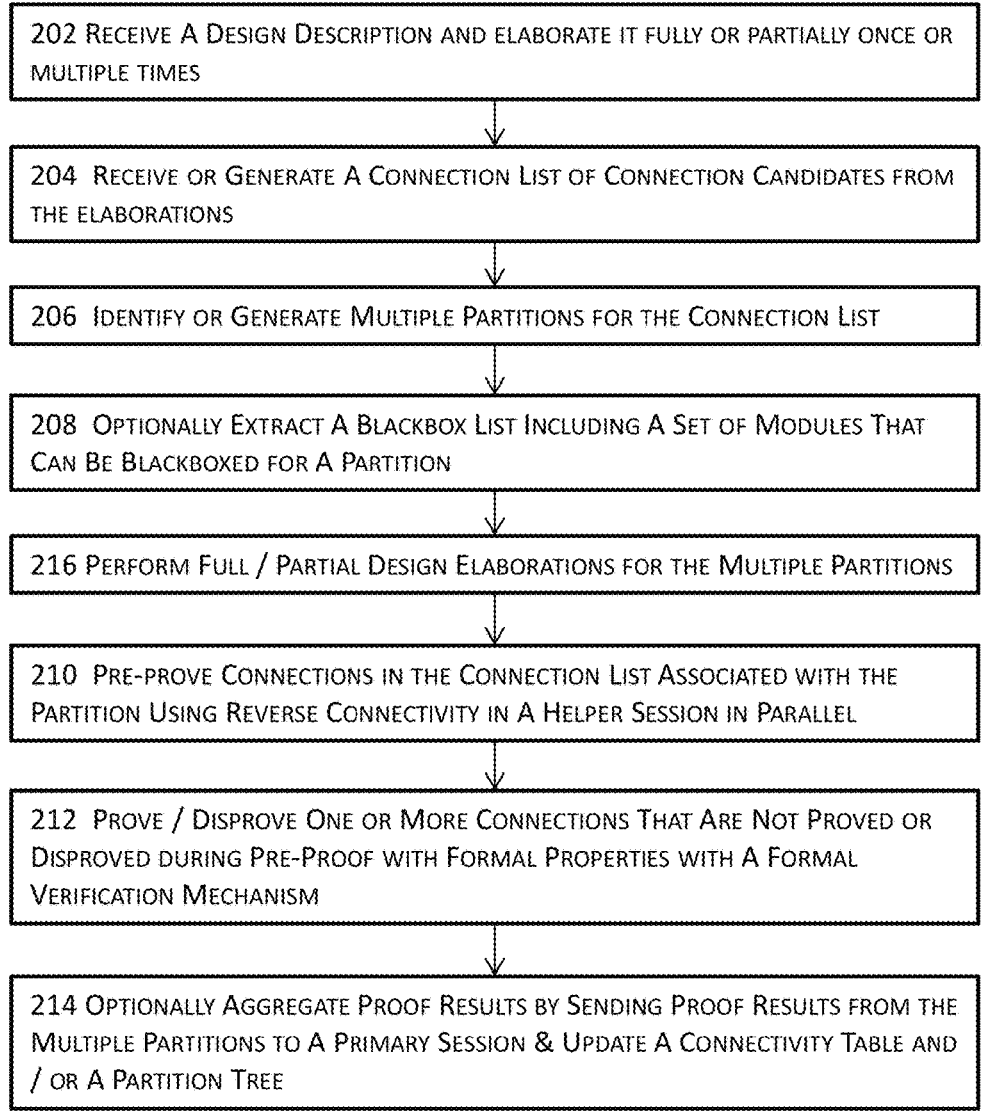
FIG. 2 illustrates a high-level block diagram for verifying connectivity of an electronic design in one or more embodiments.

FIG. 2 illustrates a high-level block diagram for verifying connectivity of an electronic design in one or more embodiments. In these embodiments, a design description may be identified at 202. In some of these embodiments, a design description may include, for example, a register transfer level (RTL) design. In some embodiments, the design description received at 202 may be fully elaborated. In some other embodiments, a partial elaboration, rather than or instead of a full elaboration, may be performed for one or more times on one or more smaller portions of the design description to elaborate only the modules or circuit components needed for proving or disproving connection checks in or associated with the one or more smaller portions without performing a full elaboration. In some of these embodiments, a multi-elaboration mechanism may be used to perform the partial elaboration for these one or more smaller portions of the design description.

At 204, connectivity for the electronic design may be received or generated by using reverse connectivity on the design description. In some embodiments, the connectivity may be expressed as a connection list of one or more connection candidates, and the connection list may be determined or generated by extracting the connections from the design description based in part or in whole upon connection classification and/or an extraction configuration. These connections extracted or generated based on the extraction configuration and/or classification are collectively referred to as the connection candidates. In some embodiment, the user may provide the connection list.

The reverse connectivity process in an extraction configuration includes various parameters, values, references, settings, etc. (collectively extraction parameters or an extraction parameter) which may be used to guide a connection extraction mechanism to extract the connections of an electronic design or a portion thereof. An extraction configuration may include default extraction parameters and/or user provided extraction parameters.

For example, a user may provide one or more source instances and one or more destination instances for which connections are desired, the level or levels of hierarchies for the extraction, etc. to the extraction configuration to guide a connection extraction mechanism to extract the connections between the source and destination instances in the hierarchical level or hierarchical levels. These extracted connections may be arranged in a data structure that may be in a form of a list, a table, a database, etc. and is referred to as a connection list.

A connection list may be expanded or contracted in one or more helper sessions. For example, a connection list including the connections across three hierarchical levels in a leaf partition of an electronic design may be expanded to include connections at one or more lower or higher hierarchical levels or to include connections between an added instance and one or more existing instances. Similarly, the connection list may also be contracted by removing, either statically before the verification flow starts or dynamically during the verification flow, to remove connections between two hierarchical levels or to remove connections between a removed instance and one or more other interconnected instances.

Classification classifies or categorizes the classes or types of connections that may be generated or extracted from the design description elaboration. For example, a first class or type of connections may include connections interconnecting a "from instance" and a "to instance". Another class or type of connections may include connections between the second hierarchical level and the third hierarchical level of the electronic design or a portion thereof. Yet another class or type may include connections within an instance across all or some hierarchical levels of the instance in the electronic design.

Other examples of classes or types may include the straight forward class or type, the simple type or class, the conditional type or class, and the complex type or class. A straightforward type or class includes a class that limits buffers as the only type of gates between a source and a destination. A simple type or class includes all of the connections of the straightforward type or class and inverters. The conditional type or class includes all of the connections of the simple type or class and one or more of latches, multiplexers, AND gates, IO (input/output) ports, and tristate circuit components. A complex type or class includes all the other circuit components not classified or categorized into a straightforward type, a simple type, and a complex type. As previously described, a user may provide user classes or types, which may be entered into an extraction configuration in some embodiments.

At 206, multiple leaf partitions may be generated for the connection list by partitioning the connection list with, for example, a classification and partitioning mechanism (e.g., 108 of FIG. 1) in some embodiments.

A blackbox list may be optionally extracted or determined at 208 to include a set of modules or circuit components that are required or desired to be blackboxed. The determination or extraction of a blackbox list may be performed based on the connectivity (e.g., the connection list) or a portion thereof (e.g., the portion of a connection list corresponding to a leaf partition). The modules or circuit component designs in a blackbox include those modules or circuit component designs that are not needed for proving or disproving the connectivity of the electronic design or a portion thereof (e.g., a leaf partition). In some embodiments, blackboxing may be optional to supplement, for example, an extraction configuration including relaxed extraction parameters or relaxed classes or types that include more classes or types of connections than what is actually needed for proving or disproving connectivity.

At 216, the design description may be fully elaborated in some embodiments or partially elaborated in some other embodiments for each partition identified or generated at 206, according to the blackbox list determined at 208. In these latter embodiments, a partial elaboration, rather than or instead of a full elaboration, may be performed for leaf partitions to elaborate only the modules or circuit components needed for proving or disproving connection checks in or associated with the leaf partition without performing a full elaboration in some embodiments. In some of these embodiments, a multi-elaboration mechanism may be used to perform the partial elaboration for a leaf partition.

After the connectivity (e.g., a connection list) is partitioned into multiple leaf partitions, a partial elaboration may be performed for a leaf partition to elaborate just the modules and/or circuit components needed for verifying the connectivity for the leaf partition, without performing a full elaboration for the entire electronic design. In a parallel or distributed computing environment, each computing node may invoke, for example, a multi-elaboration mechanism to perform a partial elaboration, rather than a full elaboration, although the multi-elaboration mechanism is nevertheless capable of perform full elaborations. These computing nodes in the parallel or distributed computing environment may then perform their respective connectivity verification for their respective partitions.

In addition, these embodiments partition the connectivity (e.g., a connection list), rather than the electronic design itself, and elaborate only the needed modules and/or circuit components for parallel or distributed connectivity verification in some embodiments. This is in sharp contrast with other approaches that sub-divide an electronic design for parallel computing.

Conventional connectivity verification approaches often use brute force techniques and rely on a powerful computing system to prove or disprove the connectivity of an electronic design. Even when these conventional approaches utilize parallel proof schemes, the processors, processor cores, or computing systems in the parallel computing paradigm may nevertheless load the entire connectivity or even perform full elaboration for the entire electronic design although each computing node in the parallel paradigm only processes a smaller portion of the connectivity. In contrast, some techniques described herein partition the connectivity into a plurality of leaf partitions and prove or disprove the plurality of leaf partitions in parallel or in a distributed computing environment in some embodiments.

In these embodiments, a partial elaboration may be performed with a multi-elaborator at 216. A multi-elaborator may elaborate all of the modules needed for an entire electronic circuit design in some embodiments or may elaborate a smaller portion thereof in some other embodiments. Therefore, a multi-elaborator may perform a full or partial elaboration for an electronic design. In one embodiment, for example, when an electronic design is loaded for a verification flow, a master session is initialized at the beginning of the verification flow, while helper sessions may be created later to perform different elaborations of the design.

Some embodiments described herein partition the connectivity list of the electronic design into a plurality of leaf partitions, and each leaf partition may be verified in a helper session. In these embodiments, a multi-elaborator may elaborate just the modules needed for a partition for proving or disproving some or all of the connections for a leaf partition of the entire electronic design. In some of these embodiments, the plurality of leaf partitions may be verified in parallel with the corresponding helper sessions, each of which may process one or more leaf partitions.

At 210, the connection candidates or connections in the connection list associated with a leaf partition may be pre-proved. In some embodiments, the pre-proof process may be performed to verify the connection candidates or connections by using reverse connectivity in a helper session. When proving or disproving connectivity, a connectivity specification of the electronic design is often elaborated and then compared to, for example, the RTL design of the electronic design.

With reverse connectivity, the design description (e.g., an RTL design) is identified and used to generate the specification of the electronic design (and hence "reverse" connectivity). In some embodiments, the pre-proof flow may prove or disprove a connection check by simply determining whether a path for the connection may be found in the connectivity specification that is automatically generated from the design description. Determining whether a path for a connection exists from a design specification is much more cost effective than proof or disproof with formal techniques in some embodiments.

Both 204 and 210 use reverse connectivity in a similar way. For the portion of the reverse connectivity that is precise, the connectivity specification extracted in 204 may be pre-proved at 210 when the same design description is used in both 204 and 210. Some embodiments perform the extraction 204 in one design description, and then perform pre-prove at 210 in a revised design description, in which case, the pre-prove process may not confirm the connection to be valid in the revised design. There may be a portion of the reverse connectivity that is not precise, and such connection checks extracted at 204 may not be pre-proved at 210. In these embodiments, formal properties may be generated to be analyzed with the formal verification mechanism at 212.

A reverse connectivity process includes a process for generating or extracting connectivity information via a traversal process, one or more analyses, or one or more combinations thereof. For example, an electronic design or a portion thereof may be traversed forward from one or more sources (e.g., one or more source signals, one or more source instances, or any combinations thereof) or traversed backward from one or more destinations (e.g., one or more destination signals, one or more destination instances, or any combinations thereof).

Logics or circuit component designs encountered during the traversal may be optionally recognized as or classified into one or more categories based in part or in whole upon one or more criteria. In some embodiments, the one or more criteria may include, for example, the contribution of circuit component designs or logic to connection definitions, timing attributes (e.g., delay, etc.), conditions of connection, or any combinations thereof. In some embodiments, circuit component designs or logic may be categorizes into categories including, for example, a simple buffer, delay elements (e.g., flops, latches, etc.), conditional elements (e.g., multiplexers), a divergence point where a path splits into two or more parallel paths, a convergence point where two or more paths merge back into a single path, and one or more complex elements that are not classifiable into the other categories.

Once the categories of circuit component designs or logic are recognized or identified, immediately neighboring logics or circuit component designs of the same category may be grouped into a single element (e.g., an edge in a connectivity graph). For example, in some embodiments where a graph is subsequently constructed with the information extracted by traversing the electronic design, immediately neighboring circuit component designs or logics of the same category may be grouped into a segment represented as an edge connecting two nodes in the graph. connectivity information (e.g., one or more condition definitions, one or more properties, etc.) may be extracted based in part or in whole upon one or more criteria.

In some embodiments, the one or more criteria include the results of one or more analyses. For example, one or more functional analyses or path analyses may be performed to itemize simple conditions into a series of signal value pairs and/or to capture complex conditions as a generic Boolean condition. This process for extracting or generating connectivity information by traversal, one or more analyses, and extraction may be sometimes referred to as a "reverse connectivity" process, and the underlying analysis may be sometimes referred to as a reverse connectivity analysis. More details about the reverse connectivity process are described in U.S. patent application Ser. No. 14/754,630, filed concurrently and entitled "METHODS, SYSTEMS, AND ARTICLES OF MANUFACTURE FOR AUTOMATIC EXTRACTION OF CONNECTIVITY INFORMATION FOR IMPLEMENTATION OF ELECTRONIC DESIGNS". The content of the aforementioned U.S. patent application is hereby expressly incorporated by reference in its entirety for all purposes.

In some embodiments including connections or connection checks that have not or cannot be proved or disproved (e.g., undetermined connections) during pre-proof at 210, properties for these connections or connection checks may be automatically generated, and a verification mechanism may use formal methods to prove or disprove these generated properties at 212 in some embodiments. One of the advantages of these techniques described with reference to FIG. 2 is that formal verification of connectivity is computation resource intensive and costly due to the existence of billions or more connections in a modern electronic design, and that the intensiveness and cost of connectivity verification may be alleviated by performing a pre-proof on the automatically generated specification of an electronic design and by generating those properties that have not or cannot be proved or disproved during the pre-proof flow, rather than using formal techniques to prove all of the properties to be verified.

At 214, proof results of two or more leaf partitions in their respective helper sessions may be optionally aggregated or stitched into the primary session in some embodiments. In some of these embodiments, proof results of leaf partitions may be used to update the connectivity table and/or a partition tree as shown below in some of the user interface drawing figures. The separate proof results (e.g., proof results generated by parallel computing nodes) for these portions may be aggregated and/or stitched into the entire electronic design or a proof result therefor.

In some embodiments where the connection list and full elaboration results are available or known to a user (not generated by 204), connection checks to be verified may be grouped accordingly to generate leaf partitions. A leaf partition may be separately verified by using, for example, reverse connectivity. Properties for some connection checks that do not result in definitive proof results may also be generated and subsequently proved or disproved by using formal techniques, rather than applying formal techniques to all connection checks for connectivity verification. The proof results for these leaf partitions may also be aggregated to form a proof result for the entire electronic design.

Figure 3:
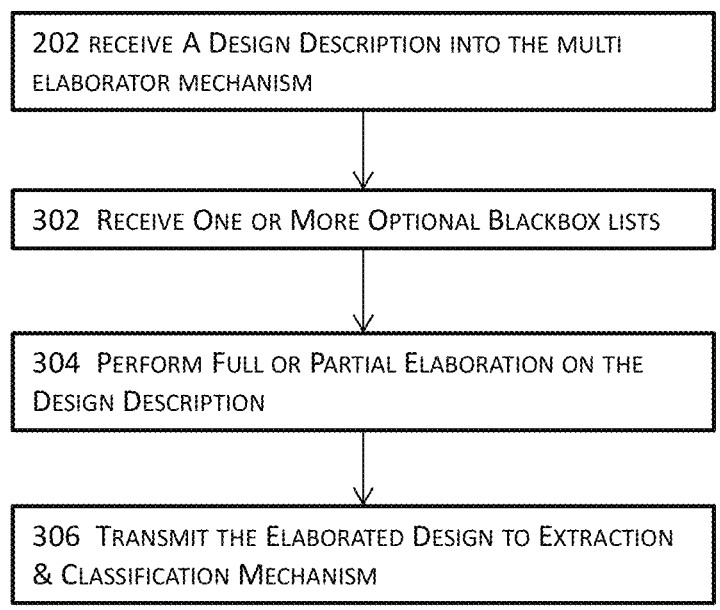
FIG. 3 illustrates a more detailed block diagram for a block in the high-level block diagram illustrated in FIG. 2 in one or more embodiments.

FIG. 3 illustrates a more detailed block diagram for a block in the high-level block diagram illustrated in FIG. 2 in one or more embodiments. More specifically, FIG. 3 illustrates more details about elaborating a design description (e.g., reference numeral 202 in FIG. 2) with a multi-elaborator in some embodiments. In these embodiments, a design description may be loaded into a multi-elaboration mechanism (e.g., 102 of FIG. 1) at 302. At 302, one or more optional blackbox lists may be provided by the user, through heuristics, or from extractions (e.g., reference numeral 208 in FIG. 2) when the process is executed multiple times. Heuristics to generate blackbox lists may take the list of N blocks instantiated by the top module of the design and create N blackbox lists, each having one of the N block not in the blackbox list and having all other N–1 blocks in the blackbox list. When the process for verifying connectivity of an electronic design is executed multiple times on the same design description or on multiple revisions of the same design description, the blackbox list obtained from prior execution may be used at 302 to perform partial elaborations at 304 for the purpose of generating connections or connection candidates from the design description being analyzed in the current execution of the process verifying connectivity of an electronic design illustrated in FIG. 3.

A multi-elaboration mechanism may elaborate all of the modules and circuit components needed for an entire electronic circuit design in some embodiments or may elaborate a smaller portion thereof in some other embodiments. Therefore, a multi-elaboration mechanism may perform a full elaboration or one or more partial elaborations for an electronic design. For example, when an electronic design is loaded for a verification flow, a master session with elaboration of the full design may be initialized for the verification flow.

Figure 4A:
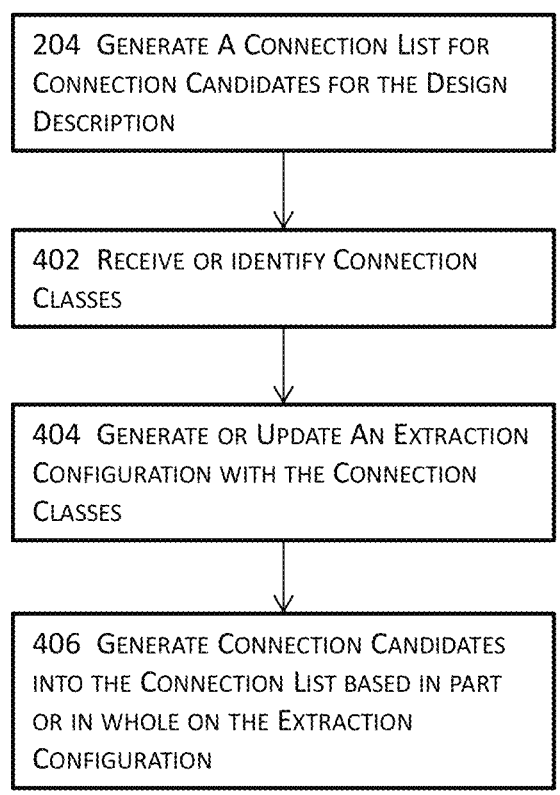
FIG. 4A illustrates a more detailed block diagram for a block in the high-level block diagram illustrated in FIG. 2 in one or more embodiments.
Figure 4B:
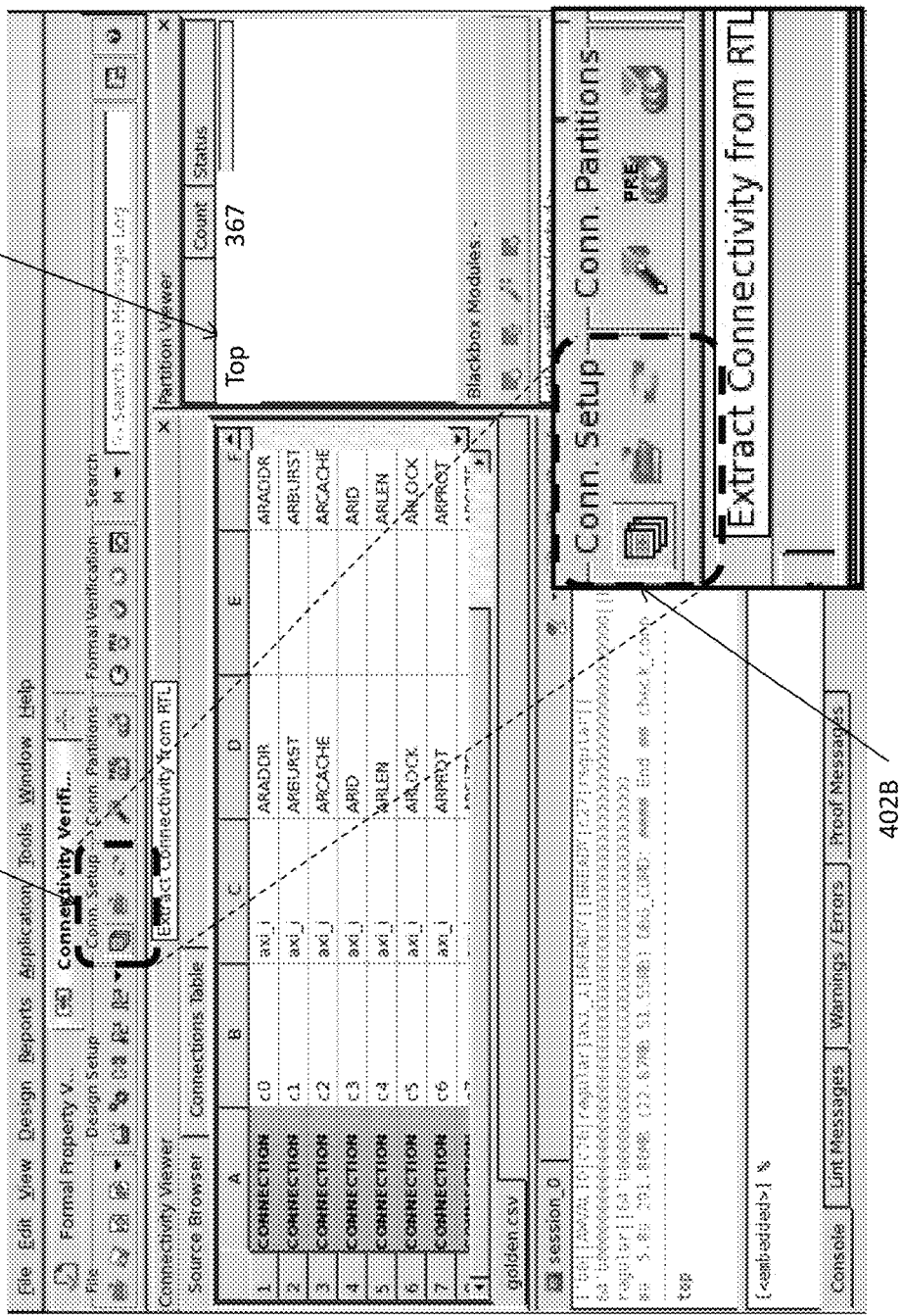
FIG. 4B illustrates a portion of a graphical user interface for generating connection candidates in one or more embodiments.

For example, FIG. 4B illustrates a portion of a graphical user interface for generating connection candidates in one or more embodiments. In these embodiments, the electronic design or a portion thereof (e.g., some instances that are blackboxed) is loaded into a session (e.g., a master session for the electronic design or a helper session for the leaf partition of the connection checks). The session shown in FIG. 4B includes a single partition—the "top" partition having a total of 367 connections.

402B of FIG. 4B indicates the user interface controls for generating or extracting connection candidates from the loaded electronic design or a portion thereof. Some embodiments described herein partition the connectivity list of the electronic design into a plurality of leaf partitions, and each leaf partition may be verified in a helper session. In these embodiments, a multi-elaboration mechanism may elaborate just the modules needed for a leaf partition for proving or disproving some or all of the connections for the leaf partition. Multiple helper sessions may be shown within the same user interface, where each of the multiple helper session may have an elaborated design with different portions (e.g., different instances) of the electronic design blackboxed. A full or one or more partial elaborations may be performed on the design description at 304, and the elaborated electronic design may then be transmitted or forwarded for the extraction and/or classification at 306.

FIG. 4A illustrates a more detailed block diagram for a block in the high-level block diagram illustrated in FIG. 2 in one or more embodiments. More specifically, FIG. 4A illustrates more details about generating a connection list (e.g., reference numeral 204 of FIG. 2) in some embodiments. In these embodiments, connection classes or types may be received from the user or identified and extracted through one or more analyses of the elaboration of the design description at 402 for analysis at 404 and 406. For example, one or more classes or types of a straightforward type, a simple type, a conditional type, a complex type, one or more user provided classes or types, or any combinations thereof may be identified at 402 as inputs for categorizing extracted connections or connection candidates in the electronic design accordingly.

At 404, an extraction configuration may be generated anew, or an existing extraction configuration may be updated with the classes or types of connections identified at 402. For example, information about a connection class or type or the new connection class or type itself may be added to the extraction configuration. In some embodiments, the connection classes or types may be identified in a negative way at 402 so that these identified connection classes or types may be removed from the extraction configuration at 404. The connection candidates may then be generated or extracted from the elaborated electronic design at 406 based in part or in whole upon the extraction configuration, typically using structural traversals of the synthesized netlist from the elaborations of the design description. A functional analysis may be added to extract non-structural details such as conditions, latencies, etc. Formal analysis engine may be used for such functional analysis, such as generating a trace showing data passing from the source to destination, and using the trace to detect the conditions that control the path of such data in some embodiments. These generated or extracted connection candidates may be categorized and arranged according to the hierarchical structure of the electronic design or a portion thereof and/or the identified connection classes or types in some embodiments. This extraction process may be sometime referred to as a "reverse connectivity" analysis.

FIG. 4B illustrates a portion of a graphical user interface for generating connection candidates in one or more embodiments. In these embodiments, the electronic design or a portion thereof is loaded into one or more sessions (e.g., a master session for the electronic design or a helper session for the leaf partition of the connection list). The session includes in the partition table 404B a single partition—the "top" partition having a total of 367 connections. 402B of FIG. 4B indicates the user interface controls for setting up the extraction configuration, identifying connection classifications or types, and/or generating or extracting connection candidates from the loaded electronic design or a portion thereof. In some embodiments, these user interface controls allow a user to interact with one or more mechanisms (e.g., a classification and partition mechanism, an extraction configuration mechanism, etc.) to set up the environment for extracting connectivity for the loaded electronic design or a portion thereof. An example of a dialog box that may be activated or invoked via these user interface controls is illustrated in FIG. 4C and described below; and the extraction based on such information generated the 367 connections as shown in 404B in this example.

Figure 4C:
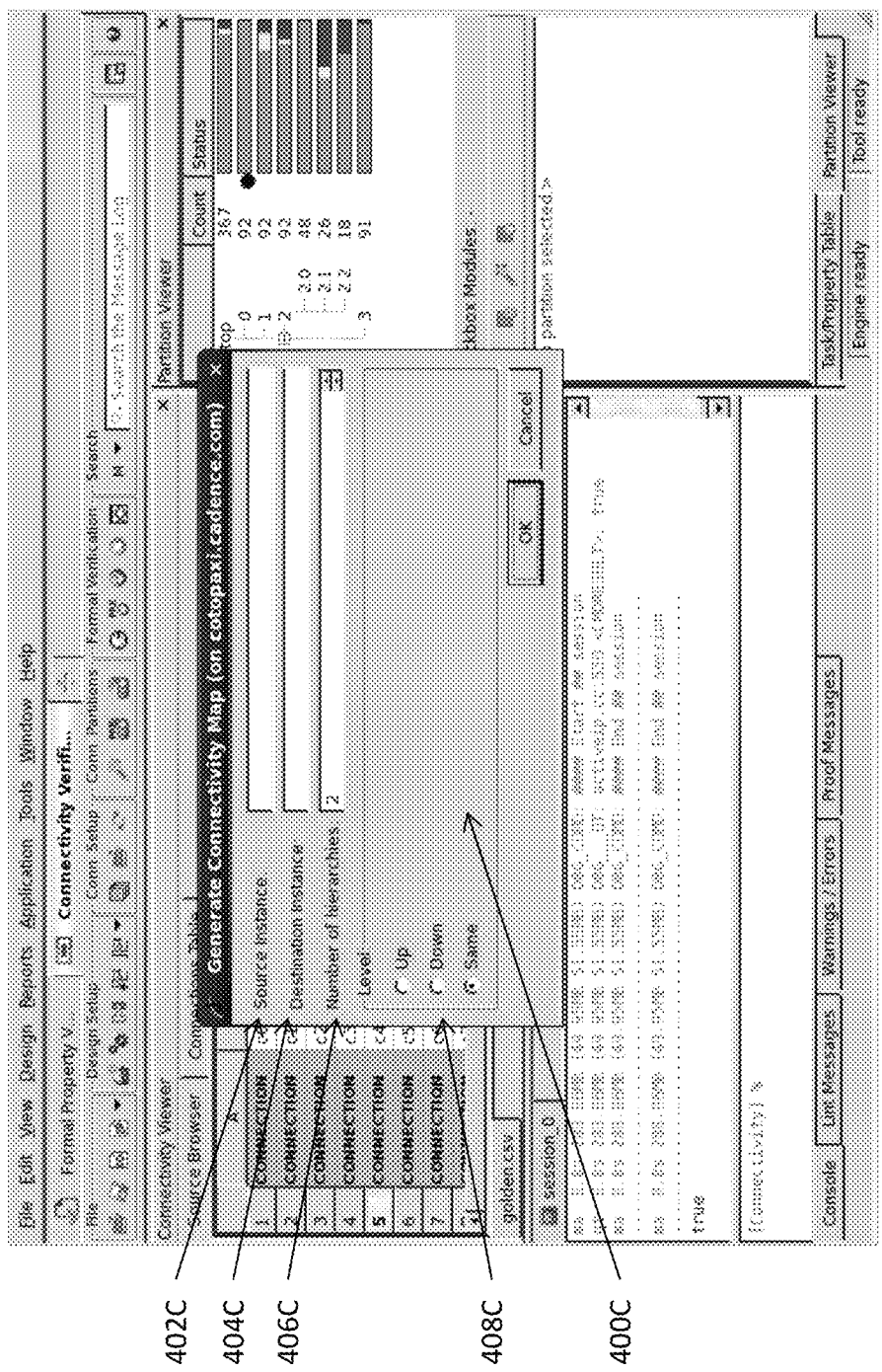
FIG. 4C illustrates a portion of a graphical user interface for generating connectivity map or list in one or more embodiments.

FIG. 4C illustrates a portion of a graphical user interface for generating connectivity map or list in one or more embodiments. In these embodiments, the actuation of a user interface control (e.g., by clicking on one of the control buttons in 402B of FIG. 4) brings up a dialog box 400C which allows the user to specify, for example, one or more source instances of connection candidates 402C, one or more destination instances of connection candidates 404C, the number of hierarchies 406C across which connection candidates are to be generated or extracted, and whether the number of hierarchies 406C include higher or lower hierarchies or the same hierarchical level 408C in some embodiments.

Figure 5A:
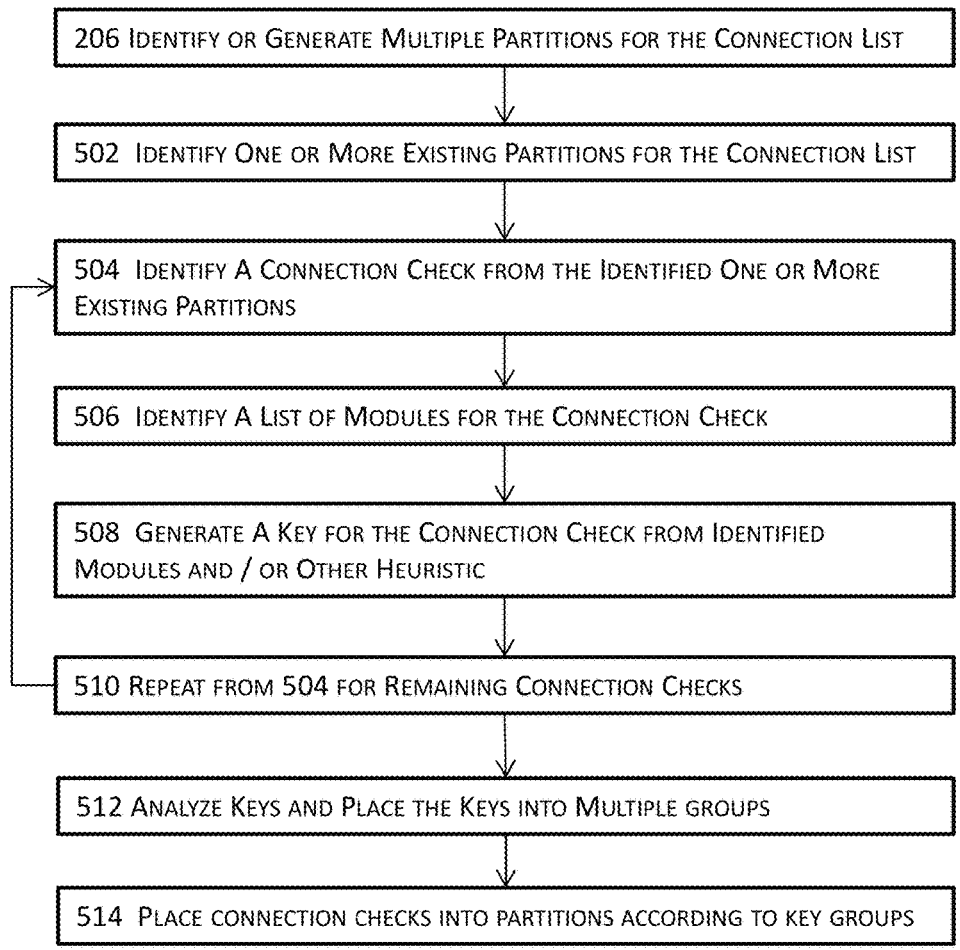
FIG. 5A illustrates a more detailed block diagram for a block in the high-level block diagram illustrated in FIG. 2 in one or more embodiments.

FIG. 5A illustrates a more detailed block diagram for a block in the high-level block diagram illustrated in FIG. 2 in one or more embodiments. More specifically, FIG. 5A illustrates more details about identifying or generating multiple partitions for a connection list (e.g., reference numeral 206 of FIG. 2). In these one or more embodiments, one or more existing partitions of a connection list, if existing, may be identified at 502. In some embodiments where a connection list has not been partitioned, the whole connection list may be identified as a partition as illustrated in FIG. 4B where the connection list for the entire electronic design or for a portion of interest thereof is identified in the partition viewer 404B of the user interface as a single partition "Top" having a total of 367 connection candidates.

A connection check from the one or more existing partitions identified at 502 may be identified at 504. A connection check includes a connection or property to be proved or disproved for connectivity verification in some embodiments. In some of these embodiments, a connection check may include the source of a connection (e.g., "from instance") and the destination of the connection (e.g., "to instance"). In addition, a connection check may further optionally include a condition field listing one or more conditions that are to be satisfied by this connection. Once the connection check is identified at 504, a list of modules and/or circuit components needed for proving the connection check may be identified at 506, based in part or in whole on the modules in which the signals related to the source, destination, conditions reside.

In some embodiments, the list of modules and/or circuit components may be identified with the aid of, for example, heuristics, prior similar designs and/or results, artificial intelligence, the nature or characteristics of the electronic design or a portion thereof, or any other suitable manners. A key may be generated for the connection check by concatenating sorted names or identifications of the identified modules and/or circuit components and/or from other heuristics at 508 in some embodiments. It shall be noted that the names or identifications of the identified modules and/or circuit components may not necessarily be sorted for the concatenation although sorted names or identifications may help to reduce the total number of different keys because if these names or identifications are not sorted, permutations of the same group of names or identifications may be in a different order and generate different keys.

In some of these embodiments, the key generated at 508 may be arranged into a key structure which comprises a data structure such as a list, a table, a database, etc. At 510, the process may return to 504 to identify the next connection check, if available, in some embodiments and repeat the acts of 504 through 508 until the required or desired connections are similarly processed. The resulting keys from 508 may be analyzed at 512, and the resulting keys may be placed into multiple groups. A target number of partitions may be identified for this purpose in some embodiments. A target number of partitions indicates how many leaf partitions the electronic design or a portion thereof under consideration in the current session (e.g., a master session for the electronic design or a helper session for a leaf partition) is to be partitioned into. In one embodiment, keys composed from common modules may be placed into the same group. In another embodiment, keys with common prefixes may be placed into the same group. The target number of partitions guides the grouping process in how much different modules are allowed, or how much difference in the unmatched portion of the keys are allowed. The connection checks may be placed into their respective partitions at 514 according to how the keys are grouped (e.g., connection checks with keys in a group may be placed into the same partition.)

In some embodiments, a target number of partitions may include a user specified number or a user provided hint of the maximum number of partitions. In some embodiments, a target number of partitions may be identified or determined based in part upon a desired number of keys in a partition. For example, if a desired number of keys per partition is identified to be 50, the target number of partitions may be identified by the total number of keys in the electronic design of interest or a portion thereof and this desired number of keys per partition. This identification or determination of a target number of partitions with a desired number of keys per partition may aid load balancing in a parallel computing or distributed computing environment.

In some embodiments, a target number of partitions may be identified or determined based in part upon 402 the connection classes, the types of connection checks or the characteristics of the modules and/or circuit components needed for proof to aid load balancing. For example, if a certain type of connection check is known to need long run-time for verification, the total number of keys or connections to be proved or disproved for a partition including the key for this type of connection check may be adjusted to a smaller number to balance the load of multiple computing nodes in a parallel computing paradigm. This process of identifying or determining a target number of partitions may be repeated to break down some of the existing partitions into smaller partitions.

At 512, an exact or approximate number of keys or their connection checks may be determined for a group or a partition based in part upon the target number of partitions. For example, an exact or approximate number of connection checks may be determined by dividing the total number of connection checks by the target number of partitions in some embodiments with various rounding techniques. The number of connection checks of a key may be identified from the key structure that is used to store the data from 508. In some embodiments, the keys in the key structure may be associated with the number of connection checks in each key.

Figure 5B:
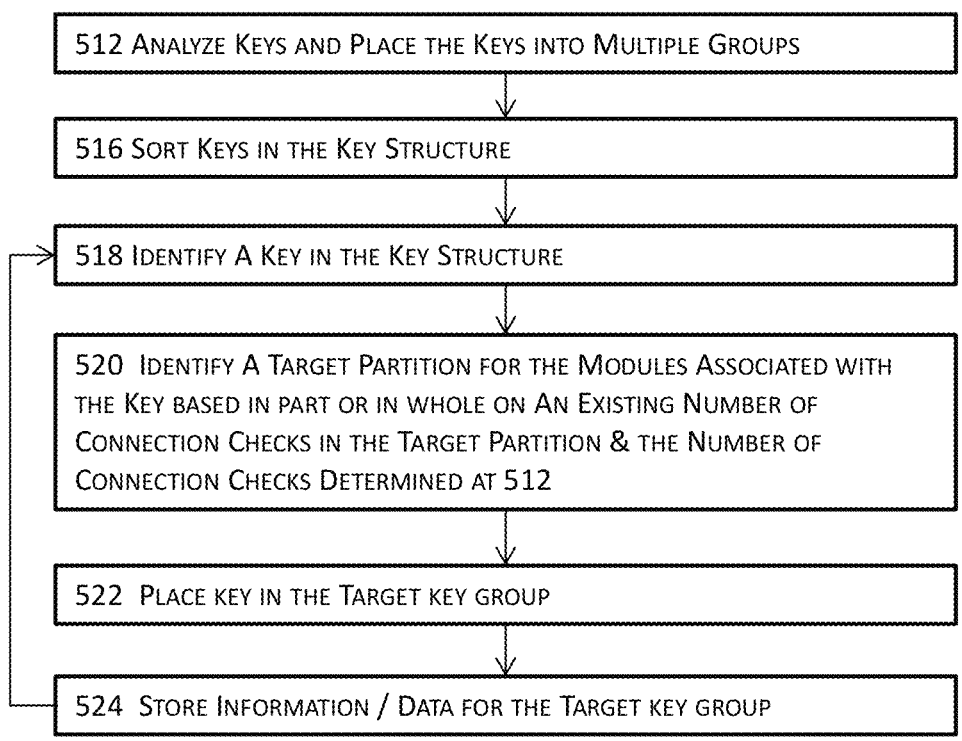
FIG. 5B describes the management and manipulation of keys in some embodiments.

FIG. 5B describes the management and manipulation of the keys in some embodiments. More specifically, FIG. 5B illustrates more details about analyzing keys and placing keys into multiple groups (e.g., reference numeral 512 in FIG. 5A). In some of these embodiments, the keys in the key structure may be further sorted at 516. For example, the keys may be sorted by the number of connection checks in each key in some embodiments. In these embodiments, these numbers of connection checks for the keys may be referenced for load balancing purposes and thus for partitioning purposes such that all or most computing nodes finish their respective verification tasks in approximately the same time. Another approach for sorting the keys is to group similar keys next to each other so that the connections having similar keys may be gathered into the same partition in some embodiments. In these embodiments, the modules and/or circuit components corresponding to the same key indicate that these modules and/or circuit components are known to be needed for proving or disproving these connections and may thus be grouped into the same partition to avoid possible errors or proof failure due to missing modules or circuit components.

The partitioning needs not to be perfect to include all the needed modules or circuit components in some embodiments because during proof, a partition may fail due to missing intermediate modules or circuit components to complete a path. In these embodiments, the missing modules or circuit components may nevertheless be recaptured by, for example, revising the blackbox list used for the partial elaboration, revising the extraction configuration and/or the connection classification, or revising both the blackbox list and the extraction configuration and/or the connection classification. The proof may be requested again for this failing partition.

At 518, a key may be identified from the key structure for processing. A target key group for the modules and/or circuit components associated with the key may be identified at 520 based in part or in whole upon an existing number of connection checks, if any, in the partition in some embodiments. In some of these embodiments, the target key group may be identified based further upon the number of connection checks associated with the key.

The key identified at 518 may be placed in the target key group at 522, and the information or data for the target key group may be stored at 524. The acts of 518 through 524 may be repeated for some or all of the keys in the key structure. In some embodiments where a partition has already included a number of connection checks that is sufficiently close to the maximum number of connection checks for the keys within a key group or the desired number of connection checks for the one or more keys within a key group, a new target key group may be identified at 520 to accommodate additional connection checks.

Figure 5C:
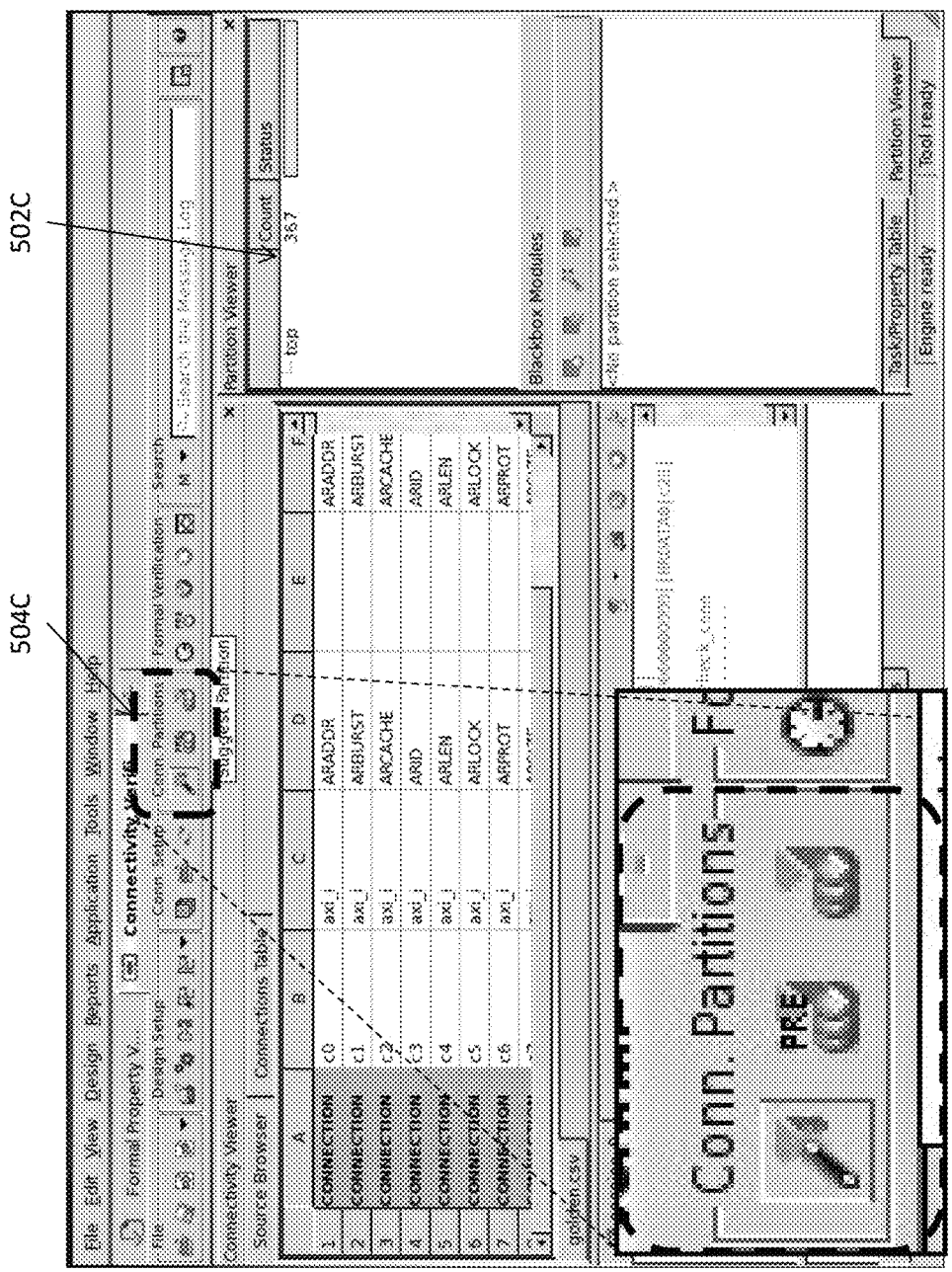
FIG. 5C illustrates a portion of a graphical user interface for partitioning an electronic design in one or more embodiments.

FIG. 5C illustrates a portion of a graphical user interface for partitioning an electronic design in one or more embodiments. In FIG. 5C, the portion of the graphical user interface includes a partition viewer 502C that shows the partition(s) of the electronic design or a portion thereof. In this example, the partition viewer 502C shows that the partition table currently includes a single partition having a total number of connection checks to be verified similar to 404B of FIG. 4B. 504C shows a portion of a toolbar for partitioning and proving the partitioned connectivity (e.g., a connection list). In some embodiments, the toolbar 504C allows proving all leaf partitions in parallel while using the list of modules and/or circuit components in a blackbox to automatically perform partial elaborations in the sessions corresponding to the leaf partitions. In some embodiments, the tool bar 504C allows proving all leaf partitions in serial in the same session, either with a different on-the-fly blackbox list applied to a global elaboration or with multiple partial elaborations, each executed before the verification of a leaf partition.

Figure 5D:
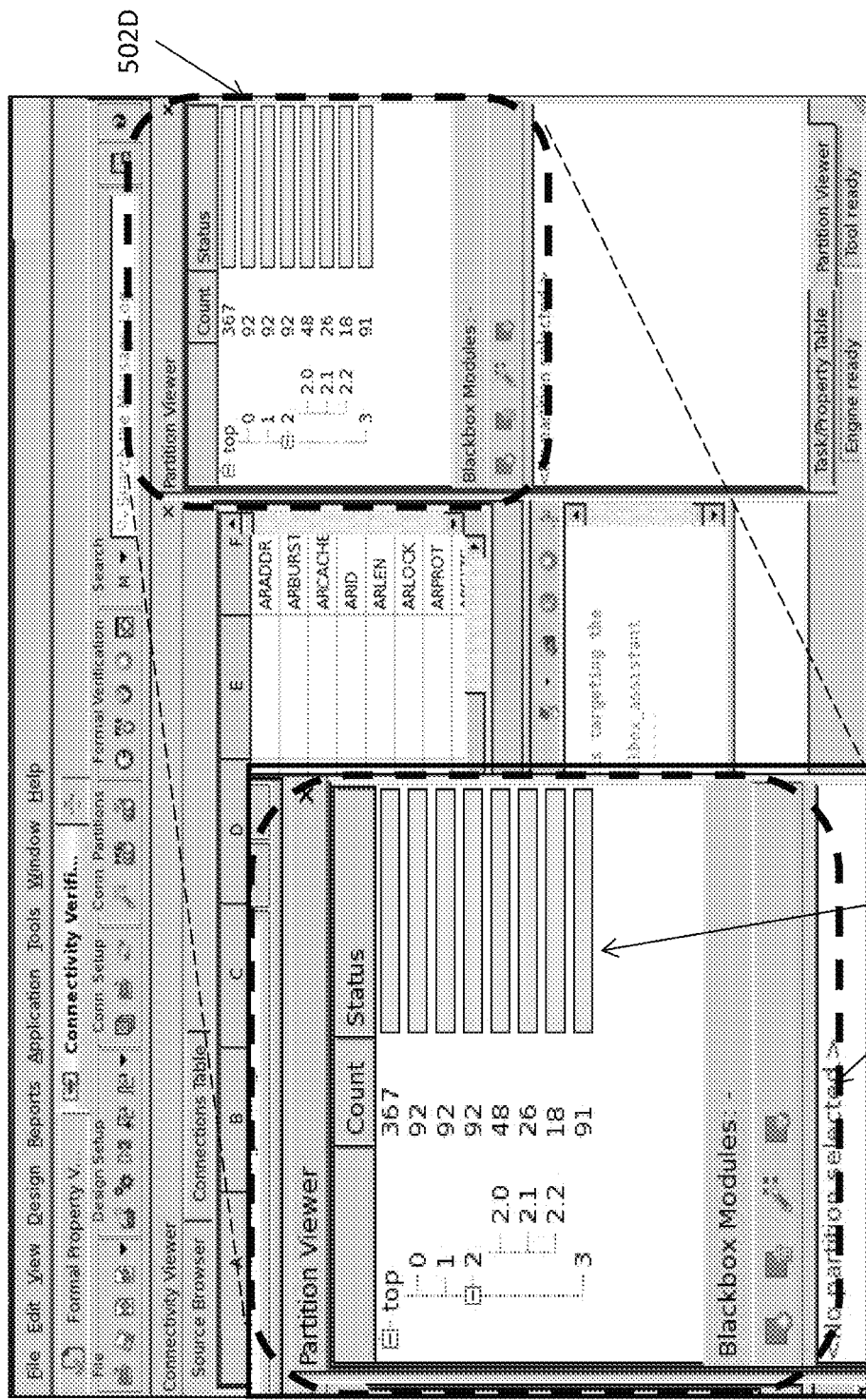
FIG. 5D illustrates an example for partitioning an electronic design into a plurality of leaf partitions in one or more embodiments.

FIG. 5D illustrates an example for partitioning an electronic design into a plurality of leaf partitions in one or more embodiments. In this example, the connectivity illustrated in a single partition in FIG. 5C is partitioned into six leaf partitions represented as "0", "1", "2.0", "2.1", "2.2", and "3". It shall be noted that the partition table in the partition viewer 502D also includes the respective connection check counts for the six partitions as well as the total number of connection checks of 367.

In addition, FIG. 5D illustrates that the top level partition "top" is partitioned into four (4) leaf partitions "0", "1", "2", and "3", and that the leaf partition "2" is further partitioned into three leaf partitions "2.0", "2.1", and "2.2". In this example, all 367 connection checks are partitioned into six leaf partitions, each having its own connection checks to be proved or disproved. Each of the respective status bars 504D for the six leaf partitions indicates the progress of the proof flow with color coded segments indicating "proved", "disproved", and "undetermined" connection checks in the "status" field for the corresponding leaf partition.

For example, the status bar may include a green segment having a first length to indicate proved connection checks, a yellow segment having a second length to indicate undetermined connection checks, and a red segment having a third length to indicate disproved connection checks, where the first, second, and third lengths respectively correspond to the percentage of proved, undetermined, and disproved connection checks of the total number of connection checks for the leaf partition.

Figure 6A:
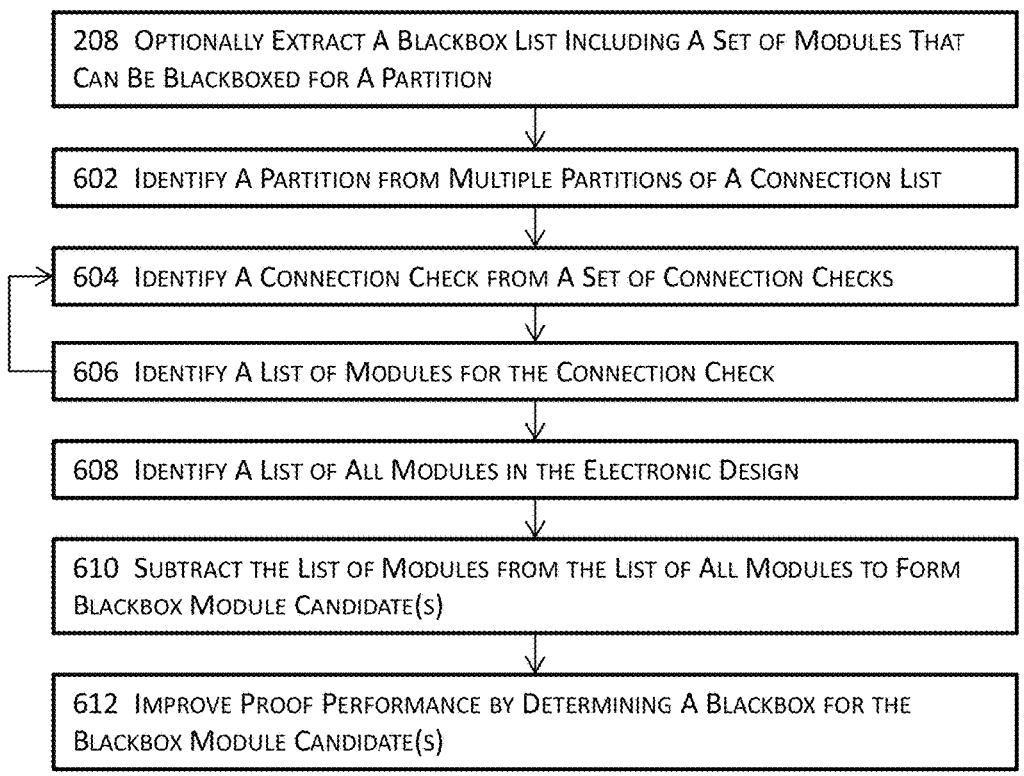
FIG. 6A illustrates a more detailed block diagram for a block in the high-level block diagram illustrated in FIG. 2 in one or more embodiments.

FIG. 6A illustrates a more detailed block diagram for a block in the high-level block diagram illustrated in FIG. 2 in one or more embodiments. More specifically, FIG. 6A illustrates more details about extracting a blackbox list for a partition. In these embodiments, a partition may be identified at 602 from a plurality of partitions of the connectivity (e.g., a connection list) of an electronic design. A connection check to be proved or disproved may be identified at 604 from a set of connection checks for the identified partition.

With the connection check identified at 604, a list of modules or circuit components may be identified for the connection check at 606. Any modules or circuit components that are needed for proving or disproving the connection check may be identified and included in the list at 606. The process may return to 604 to identify the next connection check and repeats the acts of 604 and 606. In some embodiments, all the modules and circuit components for the partition identified at 602 may be similarly processed at 604 and 606 where the identified partition corresponds to only one key. In some other embodiments where an identified partition corresponds to more than one key, a smaller subset of all modules and circuit components may be identified at 606.

For example, if a partition corresponds to the first key and the second key, all of the modules and circuit components needed for proving the connection checks associated with the first key may be identified into a first list at 606, whereas one or more modules or circuit components needed for proving the connection checks associated with the second key but not with the first key need may be ignored in the first list. Similarly, all of the modules and circuit components needed for proving the second key may be identified into a second list at 606, whereas one or more modules or circuit components needed for proving the first key but not the second key need may be ignored in the first list.

In this example, leaving a module or a circuit component needed to prove or disprove a connection check may result in a failed connection check due to missing the module or circuit component along one or more paths to complete the proof or disproof. Due to the flexibility of various techniques described herein, various aspects and types of adjustments may be made even when a module or circuit component is not included in the list of modules and/or circuit components for a connection check. For example, a user may re-identify the missing module or circuit component and request the proof with the re-identified module or circuit component in some embodiments.

In addition or in the alternative, various mechanisms (e.g., the verification mechanism, the blackbox mechanism, etc.) may provide a hint indicating that one or more modules or circuit components are not included for a connection check and thus cause the failure in the proof process. One or more of these various mechanisms may further automatically add the one or more missing modules and/or circuit components for the connection check, while sending a message to notify a user of the inclusion of these one or more missing modules and/or circuit components or waiting for the user to approve or confirm the inclusion of these one or more missing modules and/or circuit components.

At 608, a list of all modules and circuit components in the entire electronic design or in the entire partition may be identified. One or more modules and/or circuit components associated with the identified connection check identified at 606 for the connection check may be subtracted from the list of all modules and circuit components identified at 608. After the subtraction process for the connection checks in the identified partition, the remaining one or more modules and/or circuit components represent the modules and circuit components that are not needed for proving or disproving the identified connection check.

With these one or more modules and/or circuit components determined at 610, a blackbox may be determined for the identified connection check at 612. The modules and circuit components in the blackbox lists need not be elaborated or considered when proving or disproving the connection checks identified at 604 because these modules and circuit components are not needed for the connectivity verification for this partition. As a result of ignoring these modules and circuit components in the blackbox list, the performance of the proof flow is improved, and the memory footprint may also be reduce due to fewer circuit components for consideration.

In some embodiments, one or more both of the list of modules and/or components and the list of all modules and circuit components may be automatically identified by, for example, the blackbox mechanism. In these embodiments, the blackbox mechanism may either identify these modules and circuit components into a blackbox list or recommend these modules and circuit components to a user for determining a blackbox list for a partition.

Figure 6B:
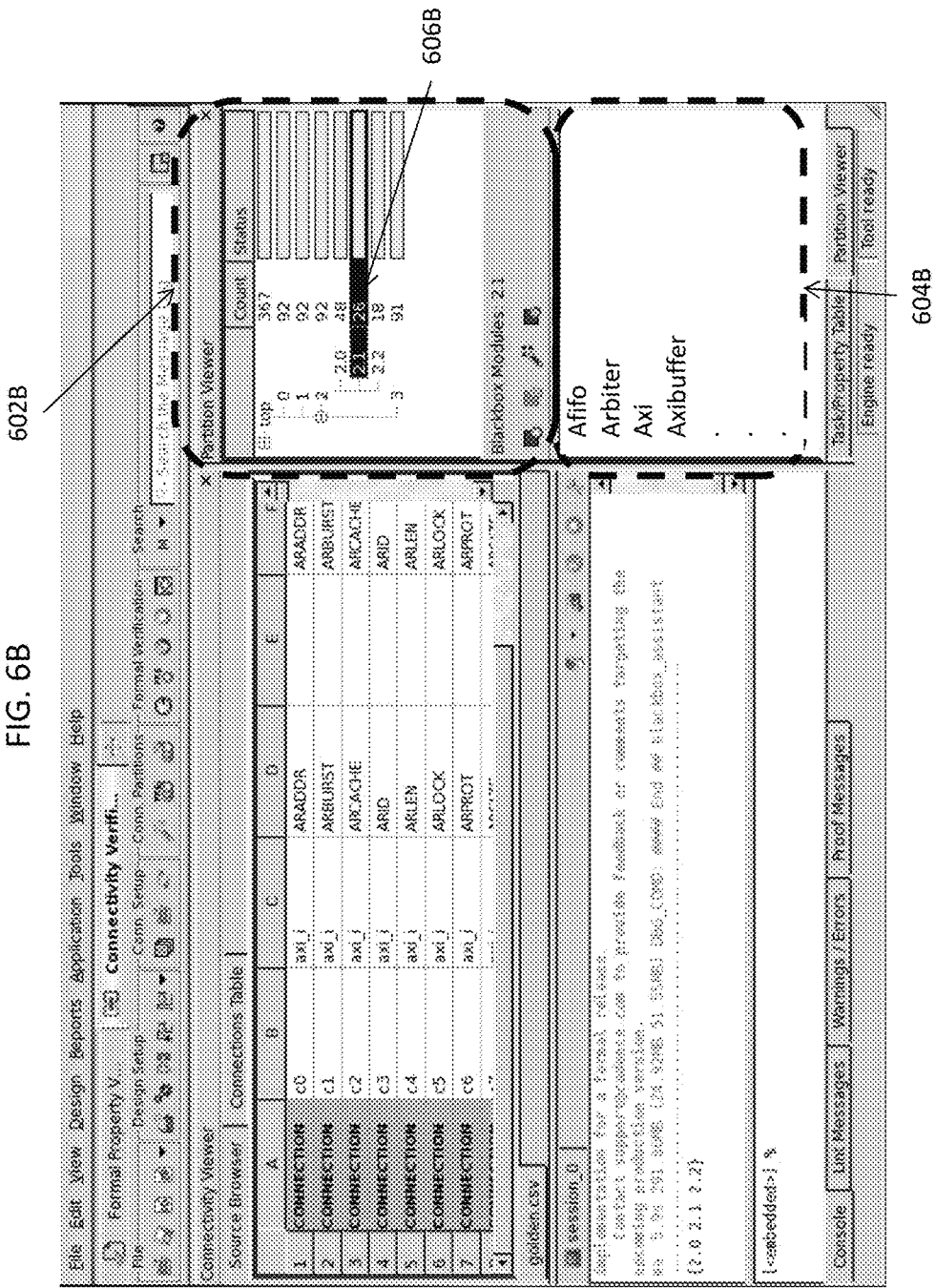
FIG. 6B illustrates an example of a user interface providing blackboxing functionality in one or more embodiments.

FIG. 6B illustrates an example of a user interface providing blackboxing functionality in one or more embodiments. More specifically, this example illustrates the inclusion of a partition viewer 602B including a partition table that lists the partitions of an electronic design similar to 502D of FIG. 5D. This example also illustrates the inclusion of a list of identifications or names of modules and/or circuit components 604B that may be identified into a blackbox list for an identified partition 606B highlighted in the partition viewer 602B. During the proof or pre-proof of this identified partition, these modules and circuit components in the blackbox list 604B may be automatically blackboxed and not considered during the proof or pre-proof of connection checks for the identified partition.

Figure 7A:
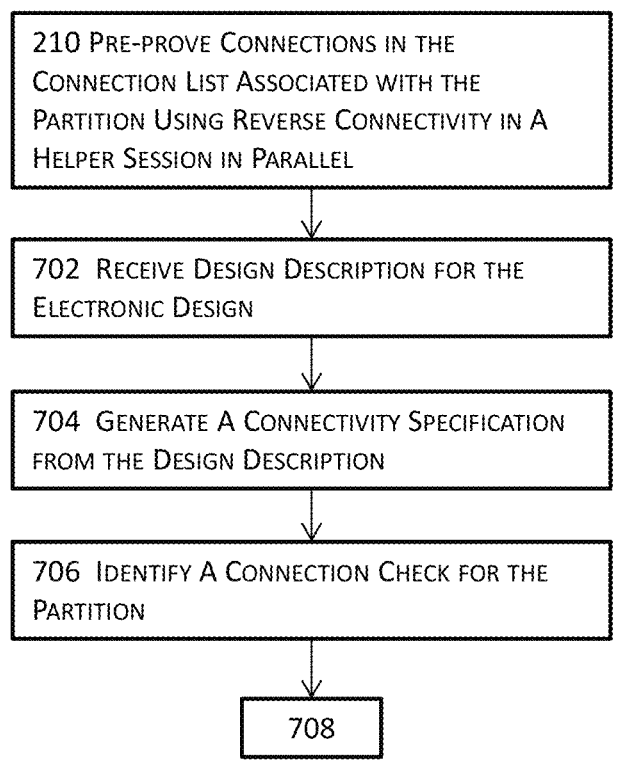
FIGS. 7A-B jointly illustrate a more detailed block diagram for a block in the high-level block diagram illustrated in FIG. 2 in one or more embodiments.
Figure 7B:
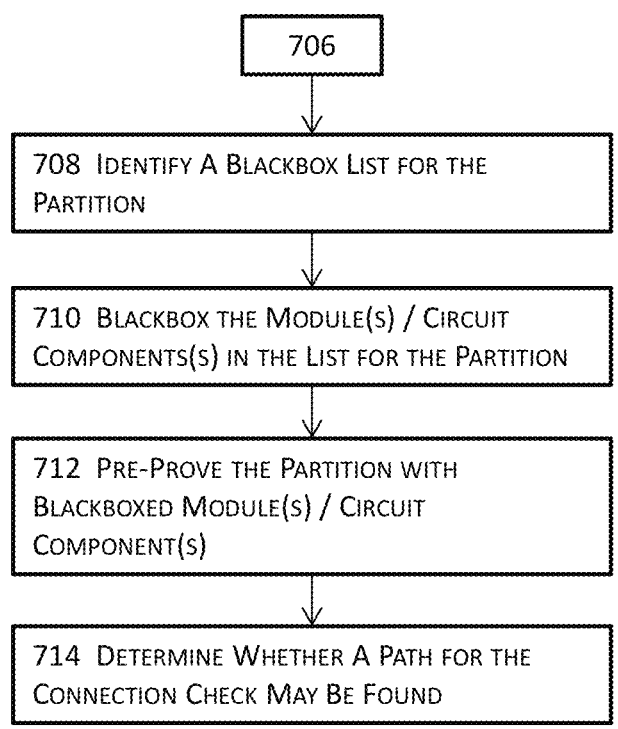

FIGS. 7A-B jointly illustrate a more detailed block diagram for a block in the high-level block diagram illustrated in FIG. 2 in one or more embodiments. More specifically, FIGS. 7A-B jointly illustrate more details about pre-proving connection checks for a partition. In these embodiments, a design description (e.g., an RTL design) may be identified or received at 702, and a connectivity specification may be generated from the design description at 704. Connectivity checks from the connectivity specification may then be pre-proved without generating connectivity properties for formal verification. This is in contrast with proving or disproving a connection check with formal methods where the connectivity properties are always generated for the connectivity checks and are analyzed with, for example, the RTL design of the electronic design.

One or more connection checks may be identified for a partition of interest at 706, and a blackbox list may be automatically identified or suggested for the partition at 708. The modules and circuit components in the blackbox list may be blackboxed and excluded from consideration during the pre-proof flow at 710. The connection checks for the partition may be pre-proved at 712 without considering the modules and circuit components in the blackbox list. Unlike formal verification which proves or disproves connection checks with formal methods or techniques, pre-proving a connection check may include determining whether or not a path for the connection check may be found at 714.

Figure 7C:
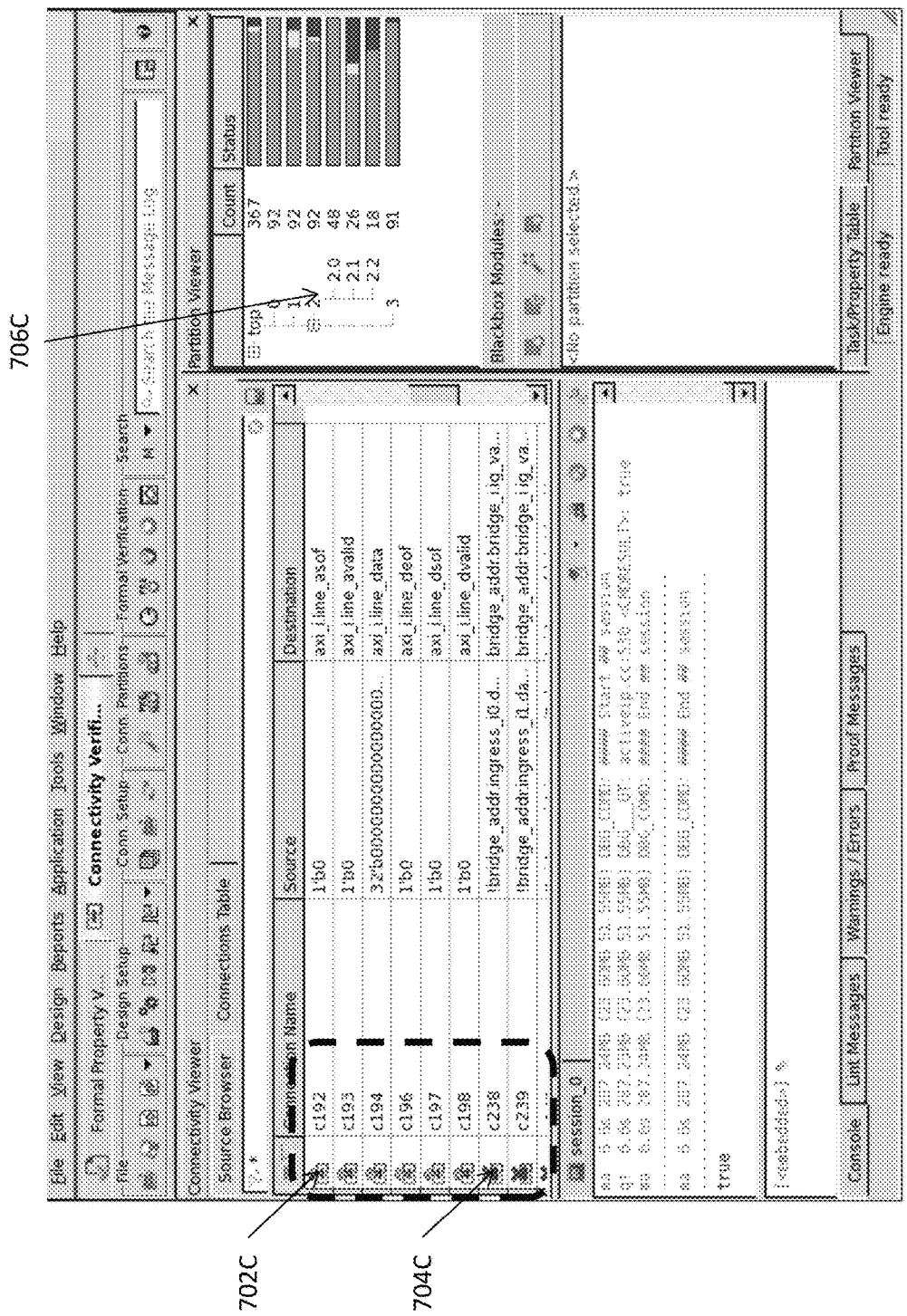
FIG. 7C illustrates an example of a user interface showing status indicators for connections during connectivity verification as well as a partition table in one or more embodiments.

FIG. 7C illustrates an example of a user interface showing status indicators for connections during connectivity verification as well as a partition table in one or more embodiments. In this example, the user interface includes a first special status indicator 702C for connections that are proved and a second special status indicator 704C for connections that are disproved during the pre-proof. Each of the respective status bars 706C for the six leaf partitions indicates the progress of the proof flow with color coded segments indicating "proved", "disproved", and "undetermined" connection checks in the "status" field for the corresponding leaf partition.

Figure 7D:
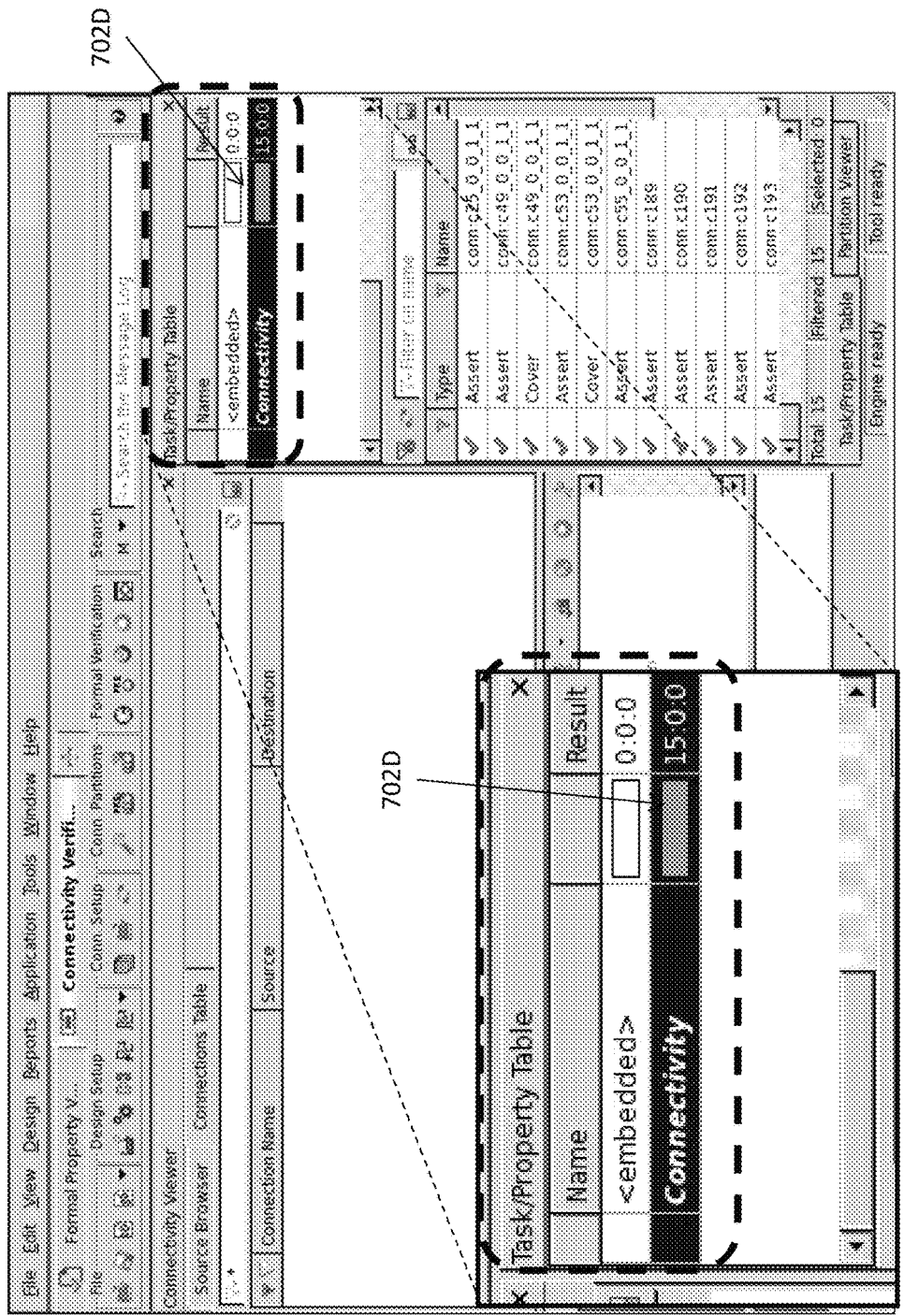
FIG. 7D illustrates an example of a user interface showing the reduction of properties for formal verification after pre-proving some connection checks in one or more embodiments.

FIG. 7D illustrates an example of a user interface showing the reduction of properties for formal verification after pre-proving some connection checks in one or more embodiments. In this example, the pre-proof has been completed for the partition of interest. For connections or connection checks that have not or cannot be proved or disproved (e.g., undetermined connections or connections failing to result in a definitive proof result) during the pre-proof flow, properties for these connections or connection checks may be automatically generated, and a verification mechanism may use formal methods to prove or disprove these generated properties.

In this example, 15 properties are generated as shown in 702D. This is in sharp contrast with the total number of connection checks of 367 as shown in, for example, 502C of FIG. 5C. Proving or disproving these 15 properties with formal methods or techniques requires much less time and computational resources than proving or disproving 367 connection checks with the same formal methods or techniques.

System Architecture Overview

FIG. 8 illustrates a block diagram of an illustrative computing system 800 suitable for verifying connectivity of an electronic design as described in the preceding paragraphs with reference to various figures. Computer system 800 includes a bus 806 or other communication mechanism for communicating information, which interconnects subsystems and devices, such as processor 807, system memory 808 (e.g., RAM), static storage device 809 (e.g., ROM), disk drive 810 (e.g., magnetic or optical), communication interface 814 (e.g., modem or Ethernet card), display 811 (e.g., CRT or LCD), input device 812 (e.g., keyboard), and cursor control (not shown).

According to one embodiment, computing system 800 performs specific operations by one or more processor or processor cores 807 executing one or more sequences of one or more instructions contained in system memory 808. Such instructions may be read into system memory 808 from another computer readable/usable storage medium, such as static storage device 809 or disk drive 810. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 807, where the one or more processors, one or more processor cores, or combination thereof executes one or more threads. For example, various acts of identifying, various acts of determining, various acts of classifying, various acts of implementing, various acts of performing, various acts of transforming, various acts of decomposing, various acts of updating, various acts of presenting, various acts of modifying, etc. may be performed by one or more processors, one or more processor cores, or combination thereof.

A mechanisms described herein may also be implemented as a pure hardware module (e.g., a block of electronic circuit components, electrical circuitry, etc.) or a combination of a hardware module and a software block that jointly perform various tasks to achieve various functions or purposes described herein or equivalents thereof. For example, a mechanism described herein may be implemented as an application-specific integrated circuit (ASIC) in some embodiments.

In these embodiments, a mechanism may thus include, for example, a microprocessor or a processor core and other supportive electrical circuitry to perform specific functions which may be coded as software or hard coded as a part of an application-specific integrated circuit, ROM (read only memory), PROM (programmable read only memory), EPROM (erasable programmable read only memory), etc. despite the fact that these microprocessor, processor core, and electrical circuitry may nevertheless be shared among a plurality of mechanism. A mechanism described herein or an equivalent thereof may perform its respective functions alone or in conjunction with one or more other mechanisms. A mechanism described herein or an equivalent thereof may thus invoke one or more other mechanisms by, for example, issuing one or more commands or function calls. The invocation of one or more other mechanisms may be fully automated or may involve one or more user inputs.

The term "computer readable storage medium" or "computer usable storage medium" as used herein refers to any non-transitory medium that participates in providing instructions to processor 807 for execution. Such a medium may take many forms, including but not limited to, non-volatile media and volatile media. Non-volatile media includes, for example, optical or magnetic disks, such as disk drive 810. Volatile media includes dynamic memory, such as system memory 808. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 800. According to other embodiments of the invention, two or more computer systems 800 coupled by communication link 815 (e.g., LAN, PTSN, or wireless network) may perform the sequence of instructions required to practice the invention in coordination with one another.

Computer system 800 may transmit and receive messages, data, and instructions, including program, i.e., application code, through communication link 815 and communication interface 814. Received program code may be executed by processor 807 as it is received, and/or stored in disk drive 810, or other non-volatile storage for later execution. In an embodiment, the computing system 800 operates in conjunction with a data storage system 831, e.g., a data storage system 831 that includes a database 832 that is readily accessible by the computing system 800. The computing system 800 communicates with the data storage system 831 through a data interface 833. A data interface 833, which is coupled with the bus 806, transmits and receives electrical, electromagnetic or optical signals that include data streams representing various types of signal information, e.g., instructions, messages and data. In embodiments of the invention, the functions of the data interface 833 may be performed by the communication interface 814.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for verifying connectivity of an electronic design, comprising:
identifying connectivity information for a design description of an electronic design;
identifying or generating, at a verification module including or coupled with at least one micro-processor of and stored at least partially in memory of a computing system, a partition of a plurality of partitions for the connectivity information at least by partitioning the connectivity into the plurality of partitions based in part or in whole upon one or more factors that comprise grouping of keys for connection checks;
elaborating, at the verification module, one or more smaller portions of the partition at least by blackboxing one or more modules and/or one or more circuit components in a blackbox list while ignoring elaboration of the one or more modules and/or one or more circuit components of the partition;
reducing a total number of properties to be verified into a reduced number of properties at least by receiving, at a user interface via a use of an input device, a pre-proof command that reduces the connection checks into a reduced number of connection checks by executing a sequence of instructions that pre-proves one or more connection checks in a pre-proof flow initiated by the pre-proof command for the electronic design by using reverse connectivity but not formal techniques for the one or more connection checks; and verifying the electronic design at least by displaying a number of formal properties generated for the reduced number of connection checks in the user interface and by performing a formal verification on the number of formal properties, while ignoring the one or more modules and/or the one or more circuit components in the black box and skipping the formal verification of the one or more connection checks that have been pre-proved.

2. The computer implemented method of claim 1, further comprising:

performing a partial or a full elaboration on the design description with a multi-elaboration mechanism, wherein the connectivity information includes a connection list structure;

identifying or generating the partition of the plurality of partitions at least by partitioning the connection list structure into the plurality of partitions; and aggregating proof results for the partition into aggregated proof results for the plurality of partitions of the electronic design.

3. The computer implemented method of claim 1, identifying or generating the partition comprising:

identifying a list of modules or circuit components for at least one connection candidate; and generating a key for the at least one connection candidate by concatenating sorted names of the list of modules or circuit components into a key structure that comprises a plurality of keys.

4. The computer implemented method of claim 3, identifying or generating the partition of the plurality of partitions further comprising:

identifying a target number of partitions;

determining one or more numbers of connection checks for keys in the key structure; and sorting the keys in the key structure based in part the one or more numbers of connection checks.

5. The computer implemented method of claim 4, identifying or generating the partition of the plurality of partitions further comprising:

identifying a target partition as the partition for the list of modules or circuit components associated with the key for the at least one connection candidate based in part or in whole on an existing number of connection checks in the target partition, and/or the one or more numbers of connection checks for the keys;

placing connection checks in the partition; and storing information or data for the partition.

6. The computer implemented method of claim 5, further comprising:

performing a pre-proof verification flow while ignoring the one or more modules and/or the one or more circuit components in the blackbox list;

proving or disproving the connection check at least by determining whether a path for a connection check is found;

determining the blackbox list for the partition, wherein the blackbox list includes a set of modules and/or circuit components;

identifying one or more connection checks from a plurality of connection candidates for the partition; and identifying one or more lists of modules and/or circuit components for the partition.

7. The computer implemented method of claim 1, further comprising:

determining the blackbox list for the partition, wherein the blackbox list includes a set of one or more modules and/or circuit components.

8. The computer implemented method of claim 7, further comprising:

performing a pre-proof verification flow while ignoring the one or more modules and/or the one or more circuit components in the blackbox list; and proving or disproving one or more connection checks at least by determining whether a path for a connection check is found.

9. The computer implemented method of claim 7, further comprising:

identifying one or more connection checks from a plurality of connection candidates for the partition; and identifying one or more lists of modules and/or circuit components for the partition.

10. The computer implemented method of claim 9, further comprising:

identifying a list of all modules and circuit components for the partition; and determining the blackbox list by subtracting the one or more lists from the list of all modules and circuit components.

11. The computer implemented method of claim 1, further comprising:

performing a pre-proof verification flow on the partition by proving or disproving at least one connection candidate of a plurality of connection candidates for the partition to generate proof results for the partition, wherein the pre-proof verification flow is performed without using formal verification methods or formal verification techniques.

12. The computer implemented method of claim 11, further comprising:

identifying one or more connection candidates from the plurality of connection candidates, wherein the one or more connection candidates fail to result in definitive proof results;

generating one or more properties for the one or more connection candidates; and proving or disproving the one or more properties with formal methods or formal techniques.

13. The computer implemented method of claim 12, further comprising:

performing a partial or a full elaboration on the design description with a multi-elaboration mechanism, wherein the connectivity information includes a connection list structure;

identifying or generating the partition of the plurality of partitions at least by partitioning the connection list structure into the plurality of partitions; and aggregating the proof results for the partition into aggregated proof results for the plurality of partitions of the electronic design.

14. The computer implemented method of claim 11, further comprising:

identifying one or more connection classes;

generating or updating an extraction configuration based in part or in whole upon the one or more connection classes; and generating or extracting at least the plurality of connection candidates into the connectivity information.

15. The computer implemented method of claim 14, further comprising:
   identifying one or more connection candidates from the plurality of connection candidates, wherein the one or more connection candidates fail to result in definitive proof results;
   generating one or more properties for the one or more connection candidates; and
   proving or disproving the one or more properties with formal methods or formal techniques.

16. A system for verifying connectivity of an electronic design, comprising:
   a plurality of mechanisms, at least one of which comprises at least one microprocessor including one or more processor cores executing one or more threads in a computing system;
   a non-transitory computer accessible storage medium storing thereupon program code that includes a sequence of instructions that, when executed by the at least one micro-processor or processor core of a computing system, causes the at least one micro-processor or processor core at least to:
   identify connectivity information for a design description of an electronic design;
   identify or generate, at one or more verification modules including or coupled with at least one micro-processor of and stored at least partially in memory of a computing system, a partition of a plurality of partitions for the connectivity information at least by partitioning the connectivity into the plurality of partitions based in part or in whole upon one or more factors that comprise grouping of keys for connection checks; and
   elaborate, at the one or more verification modules, one or more smaller portions of the partition at least by blackboxing one or more modules and/or one or more circuit components in a blackbox list while ignoring elaboration of the one or more modules and/or one or more circuit components of the partition;
   reduce, at the one or more verification modules, a total number of properties to be verified into a reduced number of properties at least by receiving, at a user interface from a user via an input device, a pre-proof command that reduces the connection checks into a reduced number of connection checks by executing a sequence of instructions that pre-proves one or more connection checks of the connection checks in a pre-proof flow initiated by the pre-proof command for the electronic design by using reverse connectivity but not formal techniques for the one or more connection checks; and
   verify, at the one or more verification modules, the electronic design at least by displaying a number of formal properties generated for the reduced number of connection checks in the user interface and by performing a formal verification on the number of formal properties, while ignoring the one or more modules and/or the one or more circuit components in the black box and skipping the formal verification of the one or more connection checks that have been pre-proved.

17. The system of claim 16, wherein the program code includes further instructions that, when executed by the at least one micro-processor or processor core, cause the at least one processor or processor core to:
   perform a partial or a full elaboration on the design description with a multi-elaboration mechanism, wherein the connectivity information includes a connection list structure;
   identify or generating the partition of the plurality of partitions at least by partitioning the connection list structure into the plurality of partitions; and
   aggregate proof results for the partition into aggregated proof results for the plurality of partitions of the electronic design.

18. The system of claim 16, wherein the program code includes further instructions that, when executed by the at least one micro-processor or processor core, cause the at least one processor or processor core to:
   perform a pre-proof verification flow while ignoring the one or more modules and/or the one or more circuit components in the blackbox list; and
   prove or disprove one or more connection checks at least by determining whether a path for a connection check is found.

19. The system of claim 16, wherein the program code includes further instructions that, when executed by the at least one micro-processor or processor core, cause the at least one processor or processor core to:
   identifying one or more connection checks from a plurality of connection candidates for the partition; and
   identifying one or more lists of modules and/or circuit components for the partition.

20. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for verifying connectivity of an electronic design, the set of acts comprising:
   identifying connectivity information for a design description of an electronic design;
   identifying or generating, at one or more verification modules including or coupled with at least one microprocessor of and stored at least partially in memory of a computing system, a partition of a plurality of partitions for the connectivity information at least by partitioning the connectivity into the plurality of partitions based in part or in whole upon one or more factors that comprise grouping of keys for connection checks;
   elaborating, at the one or more verification modules, one or more smaller portions of the partition at least by blackboxing one or more modules and/or one or more circuit components in a blackbox list while ignoring elaboration of the one or more modules and/or one or more circuit components of the partition;
   reducing a total number of properties to be verified into a reduced number of properties at least by receiving, at a user interface from a user via an input device, a pre-proof command that reduces the connection checks into a reduced number of connection checks by executing a sequence of instructions that pre-proves one or more connection checks of the connection checks in a pre-proof flow initiated by the pre-proof command for the electronic design by using reverse connectivity but not formal techniques for the one or more connection checks; and
   verifying the electronic design at least by displaying a number of formal properties generated for the reduced number of connection checks in the user interface and by performing a formal verification on the number of formal properties, while ignoring the one or more modules and/or the one or more circuit components in the black box and skipping the formal verification of the one or more connection checks that have been pre-proved.

21. The article of manufacture of claim 20, the set of acts further comprising:

identifying a list of modules or circuit components for at least one connection candidate; and generating a key for the at least one connection candidate by concatenating sorted names of the list of modules or circuit components into a key structure that comprises a plurality of keys.

22. The article of manufacture of claim 20, the set of acts further comprising:

performing a pre-proof verification flow while ignoring the one or more modules and/or the one or more circuit components in the blackbox list; and proving or disproving one or more connection checks at least by determining whether a path for a connection check is found.

23. The article of manufacture of claim 22, the set of acts further comprising:

identifying one or more connection checks from a plurality of connection candidates for the partition; and identifying one or more lists of modules and/or circuit components for the partition.

24. The article of manufacture of claim 23, the set of acts further comprising:

identifying a list of all modules and circuit components for the partition; and determining the blackbox list by subtracting the one or more lists from the list of all modules and circuit components.

* * * * *